(12) United States Patent
Chen et al.

(10) Patent No.: US 10,790,003 B1
(45) Date of Patent: Sep. 29, 2020

(54) MAINTAINING CHANNEL PRE-CHARGE IN PROGRAM OPERATION

(71) Applicant: SanDisk Technologies LLC, Addison, TX (US)

(72) Inventors: Hong-Yan Chen, San Jose, CA (US); Wei Zhao, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/528,349

(22) Filed: Jul. 31, 2019

(51) Int. Cl.
*G11C 11/22* (2006.01)
*G11C 11/406* (2006.01)

(52) U.S. Cl.
CPC ...... *G11C 11/2297* (2013.01); *G11C 11/2255* (2013.01); *G11C 11/2257* (2013.01); *G11C 11/2273* (2013.01); *G11C 11/40626* (2013.01)

(58) Field of Classification Search
CPC .......... G11C 11/2297; G11C 11/40626; G11C 11/2257; G11C 11/2255; G11C 11/2273; G11C 16/3427; G11C 16/3418; G11C 7/1048; G11C 8/08
See application file for complete search history.

(56) References Cited

U.S. PATENT DOCUMENTS

| 6,859,397 | B2 | 2/2005 | Lutze et al. |
| 7,450,430 | B2 | 11/2008 | Hemink et al. |
| 7,460,404 | B1 * | 12/2008 | Dong ..................... G11C 16/12 365/185.17 |
| 8,988,945 | B1 | 3/2015 | Miwa |
| 9,093,157 | B2 * | 7/2015 | Kwak ..................... G11C 8/08 |
| 10,008,271 | B1 | 6/2018 | Diep et al. |
| 10,297,323 | B2 | 5/2019 | Yu et al. |
| 2008/0158991 | A1 * | 7/2008 | Hemink .............. G11C 11/5628 365/185.22 |
| 2017/0076814 | A1 * | 3/2017 | Hashimoto ....... H01L 27/11582 |
| 2019/0147955 | A1 | 5/2019 | Chen et al. |
| 2019/0156901 | A1 | 5/2019 | Chen et al. |

FOREIGN PATENT DOCUMENTS

KR   10-2010-0074651 A   7/2010

OTHER PUBLICATIONS

U.S. Appl. No. 16/418,642, filed May 21, 2019.
International Search Report & The Written Opinion of The International Searching Authority dated Jul. 15, 2020, International Application No. PCT/US2020/024110.

* cited by examiner

*Primary Examiner* — Ajay Ojha
(74) *Attorney, Agent, or Firm* — Vierra Magen Marcus LLP

(57) ABSTRACT

Techniques are described for maintaining a pre-charge voltage in a NAND string in a program operation. After a pre-charge voltage is applied to the channel of a NAND string, the word line voltages are controlled to avoid a large channel gradient which generates electron-hole pairs, where the electrons can pull down the channel boosting level on the drain side of the selected word line. In one approach, the word line voltages of a group of one or more source side word lines adjacent to the selected word line are increased directly from the level used during pre-charge to a pass voltage. The word line voltages of other source side word lines, and of drain side word lines, can be decreased and then increased to the pass voltage to provide a large voltage swing which couples up the channel.

20 Claims, 23 Drawing Sheets

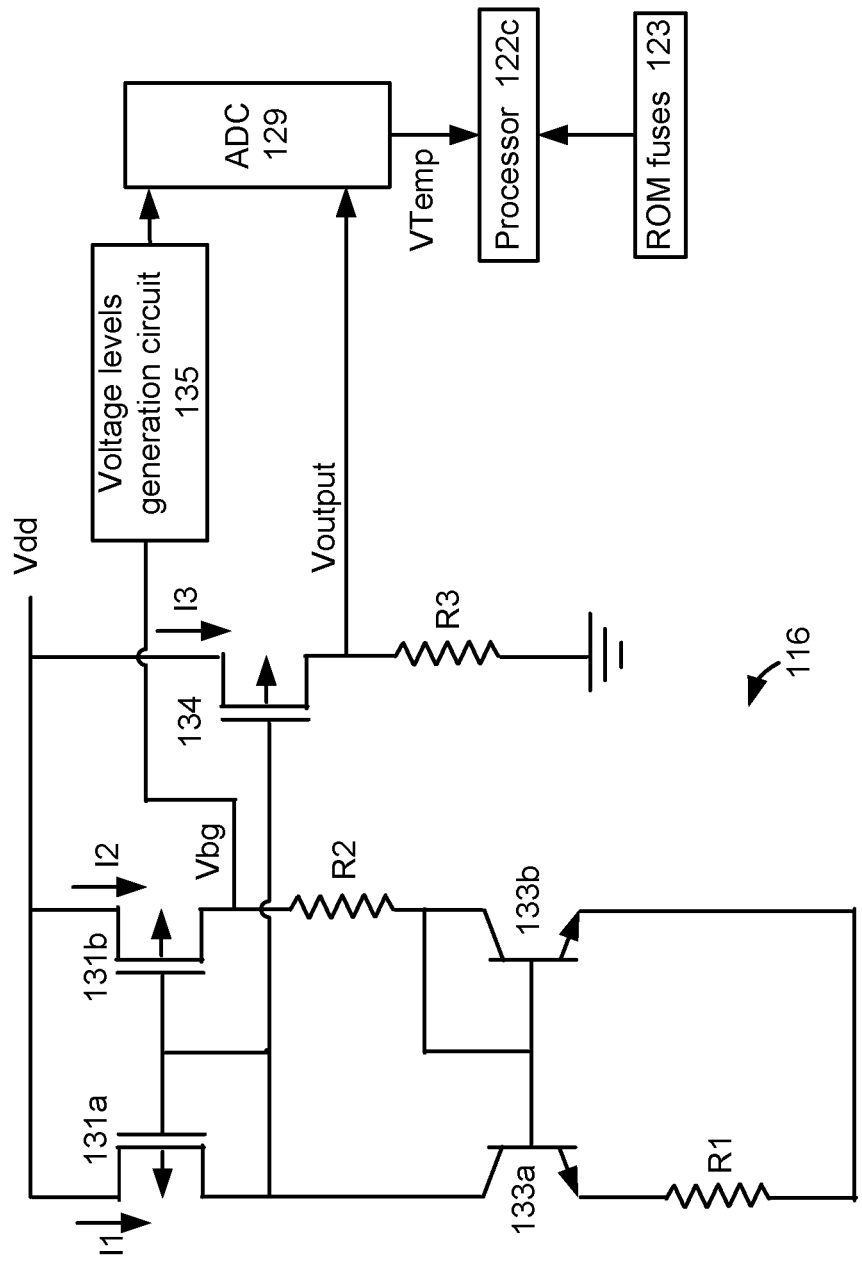

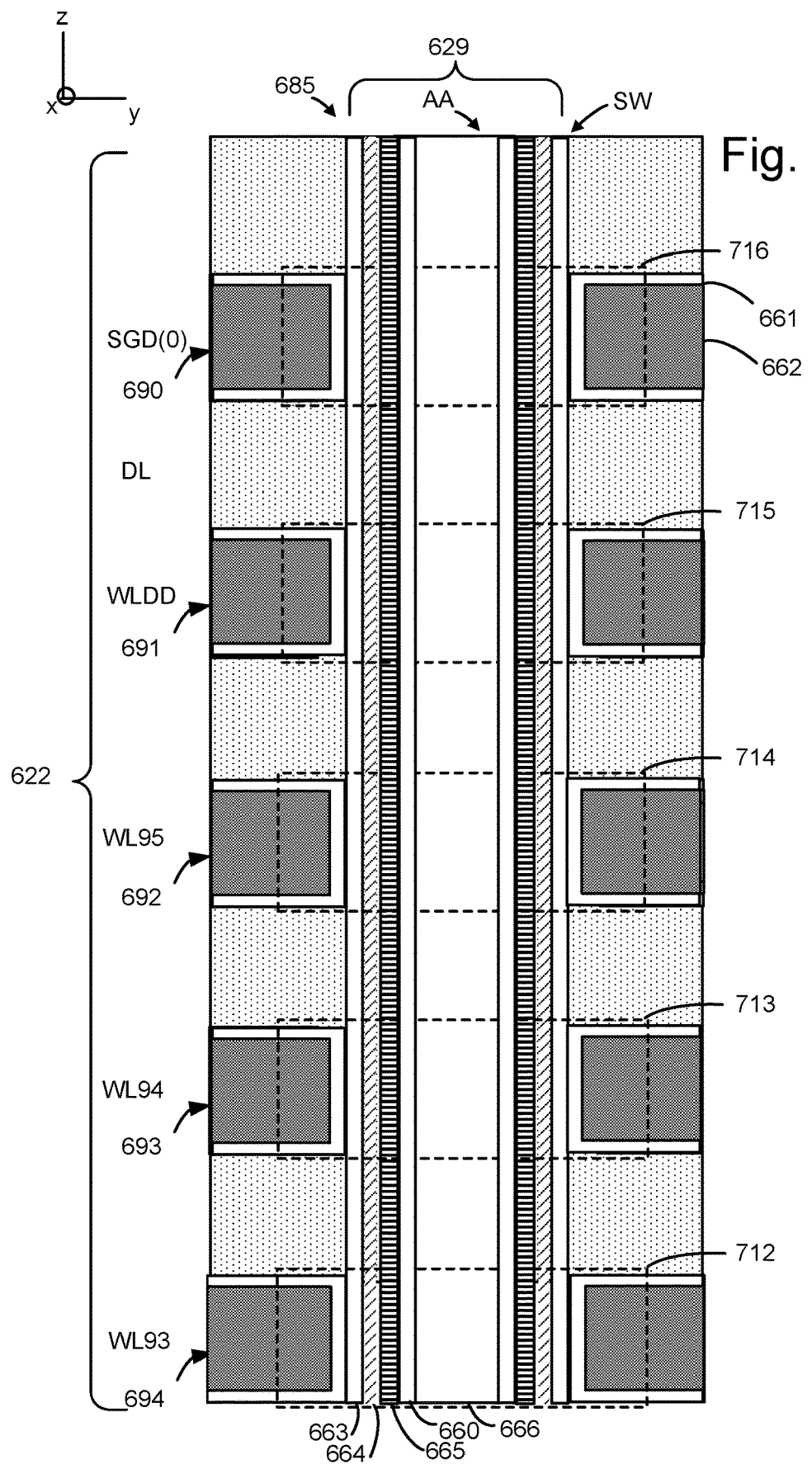

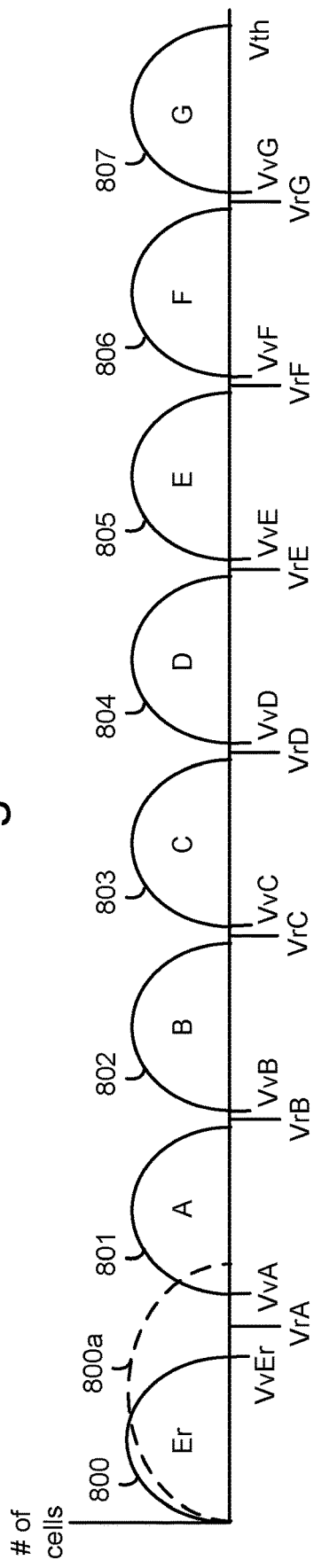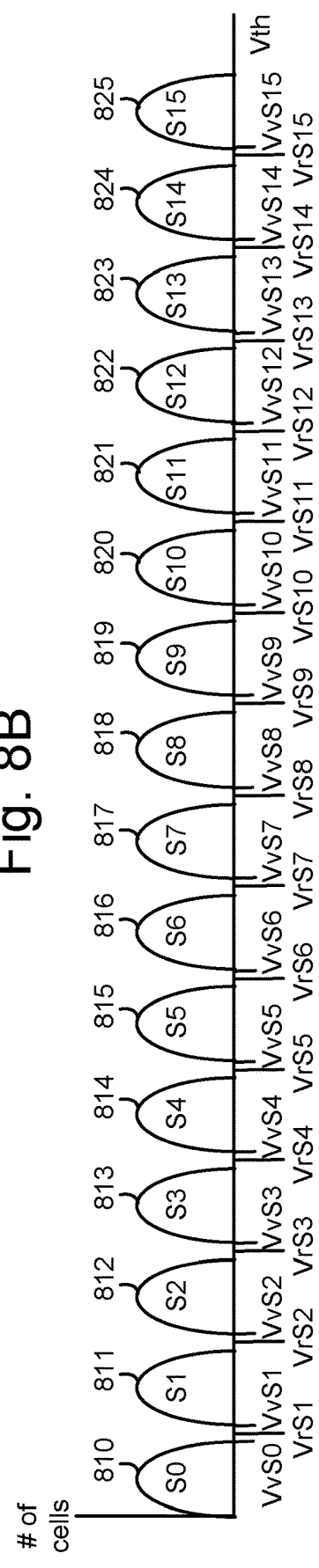

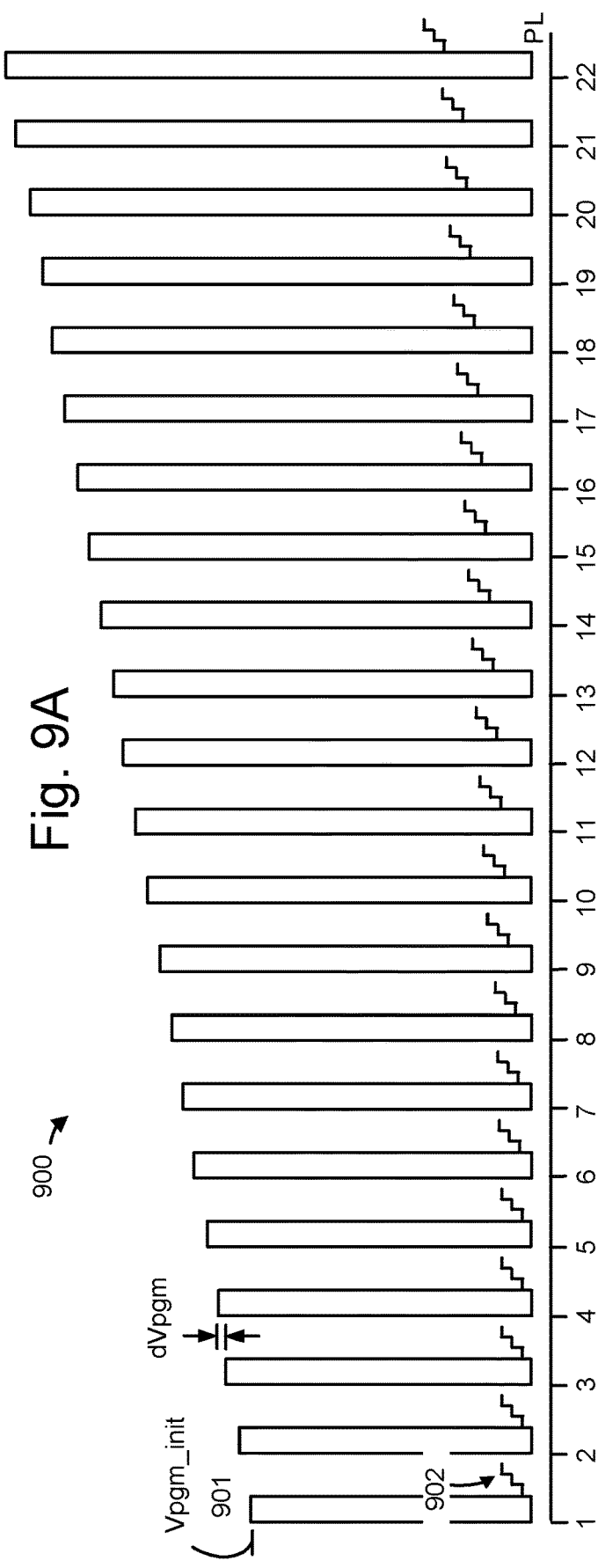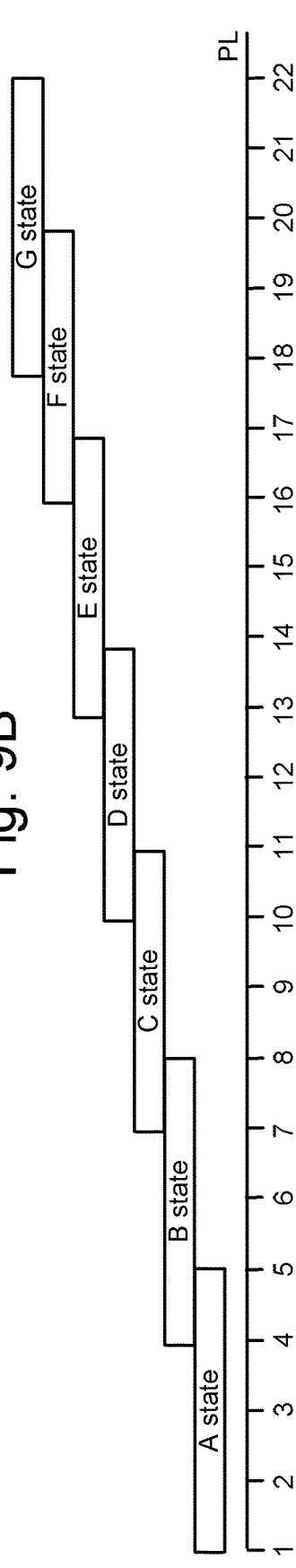
Fig. 9A
Fig. 9B

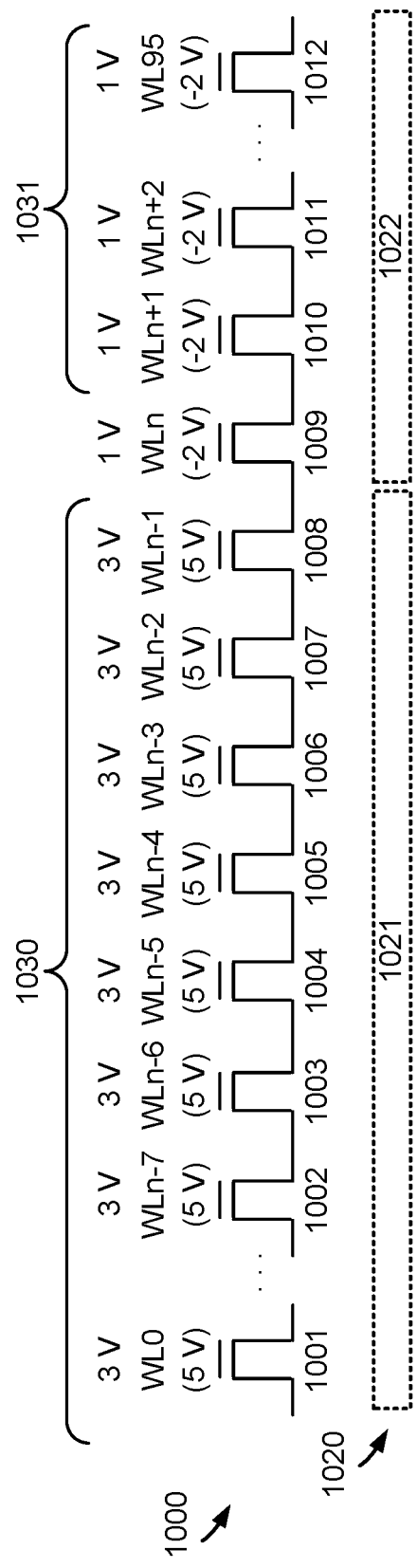
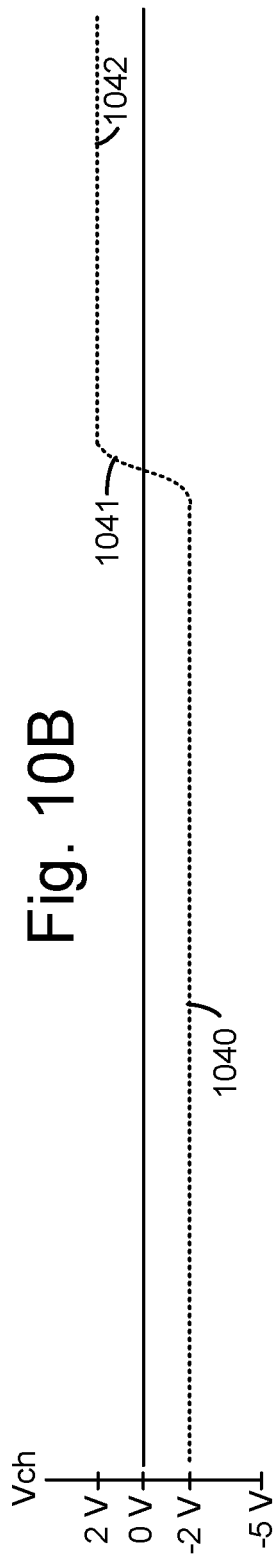
Fig. 10A
Fig. 10B

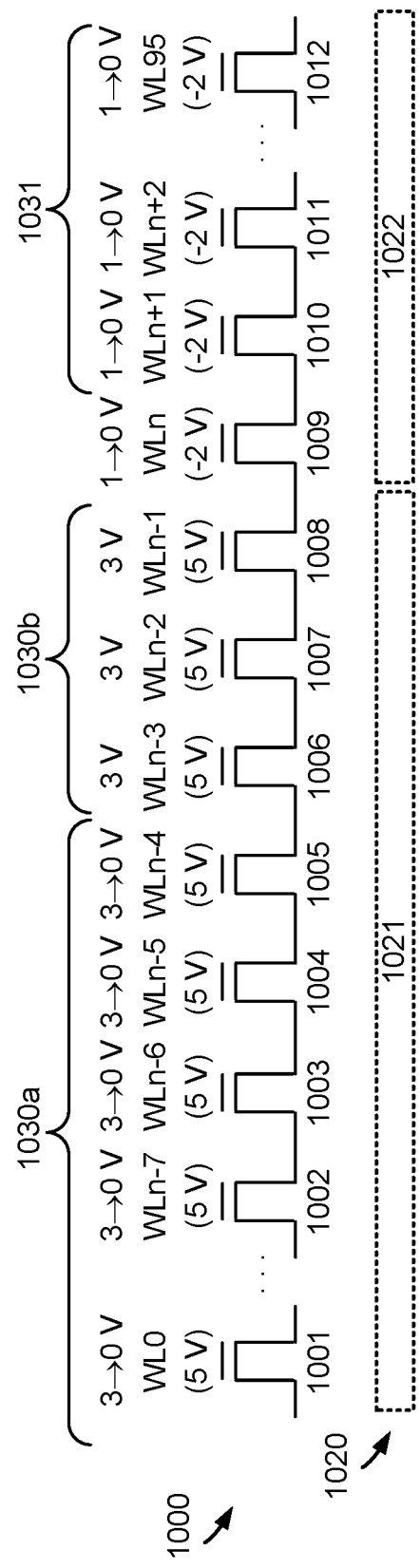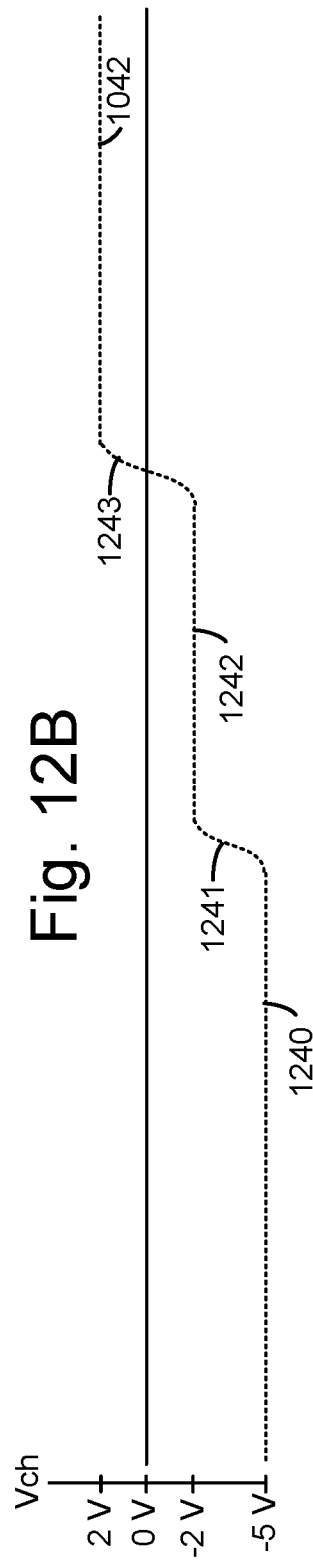

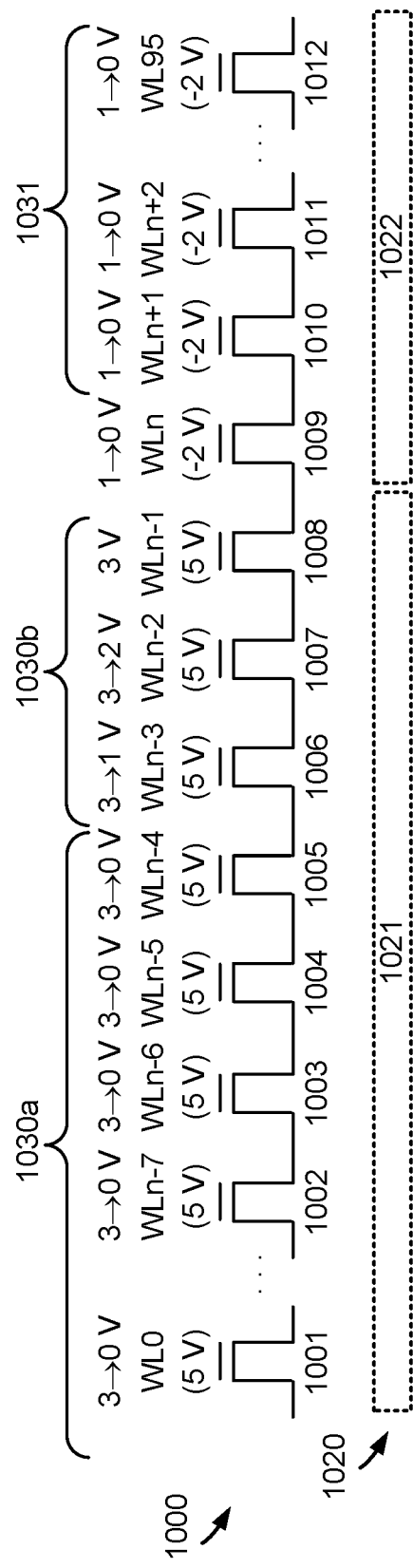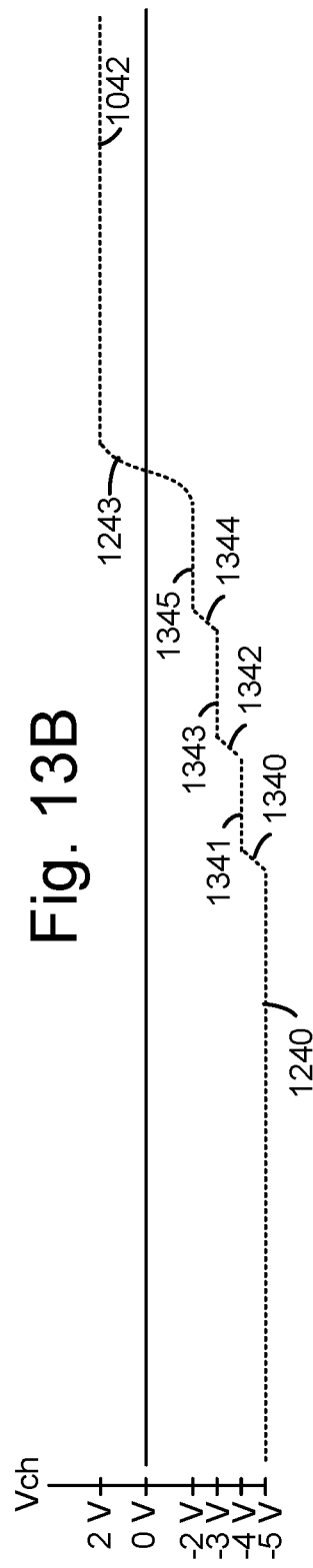
Fig. 13A
Fig. 13B

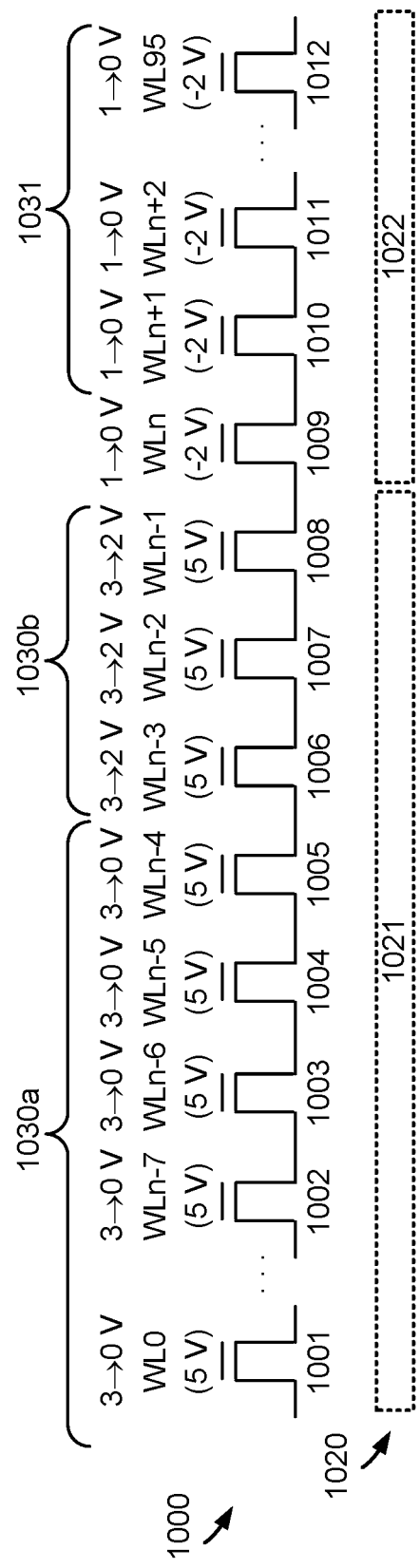
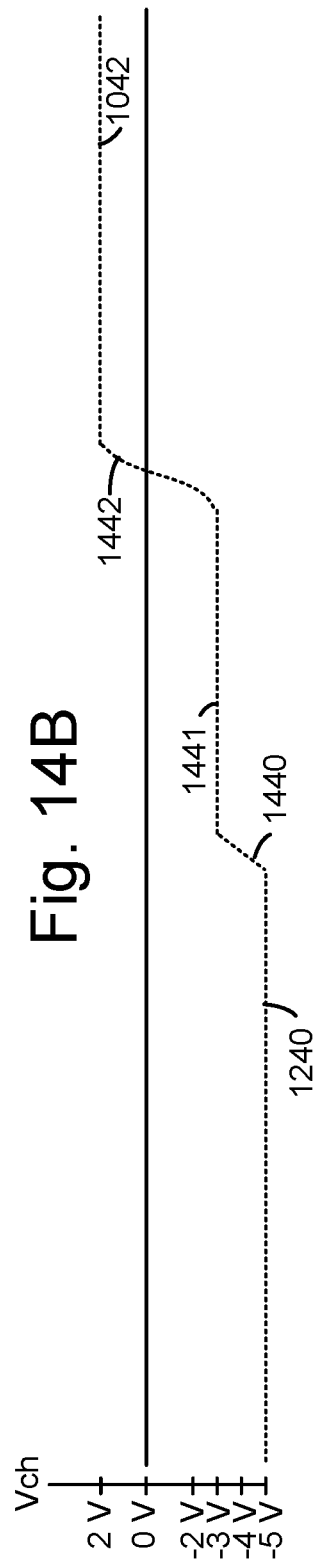
Fig. 14A
Fig. 14B

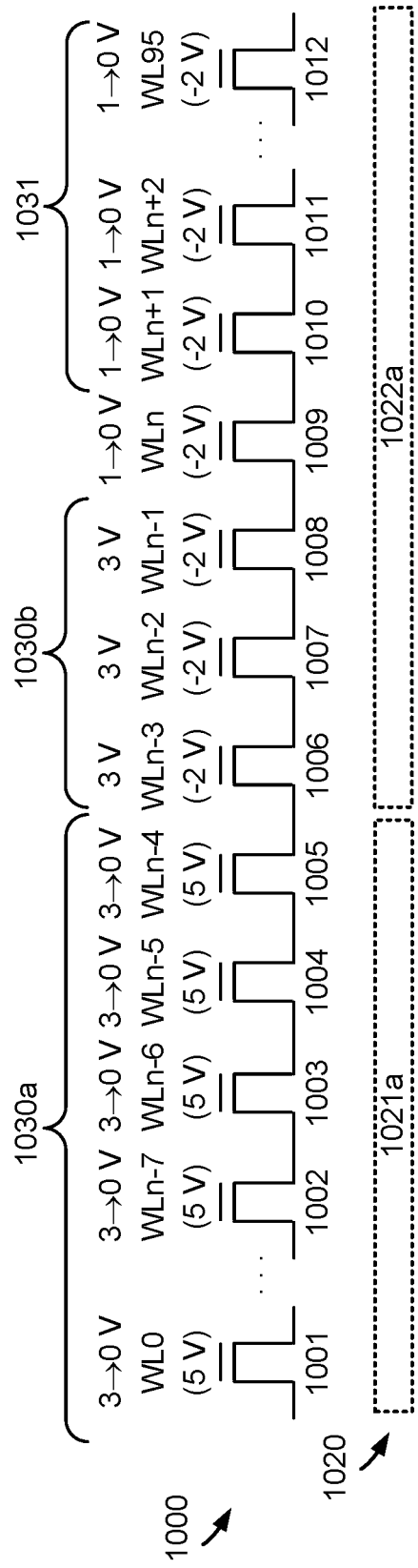
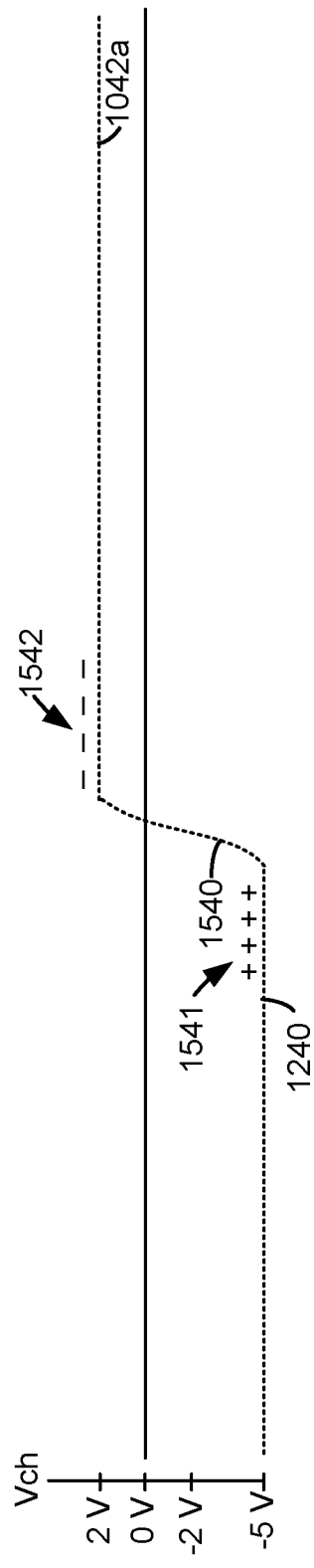
Fig. 15A
Fig. 15B

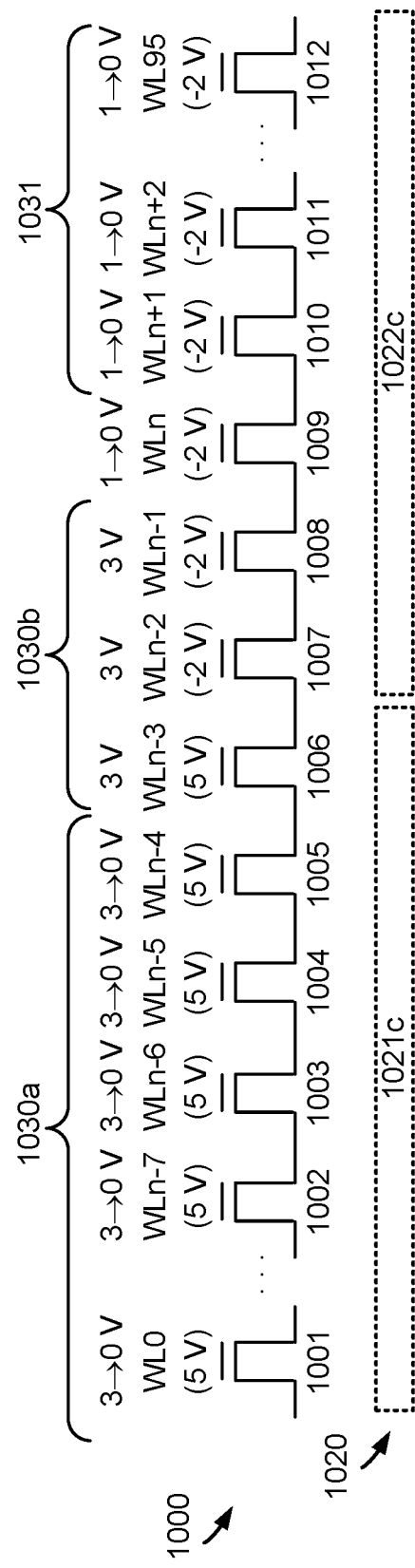
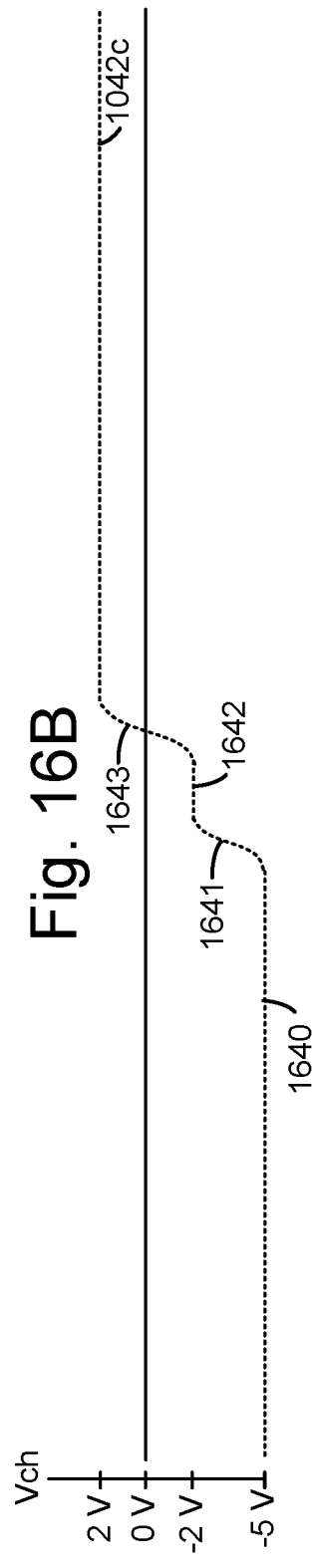

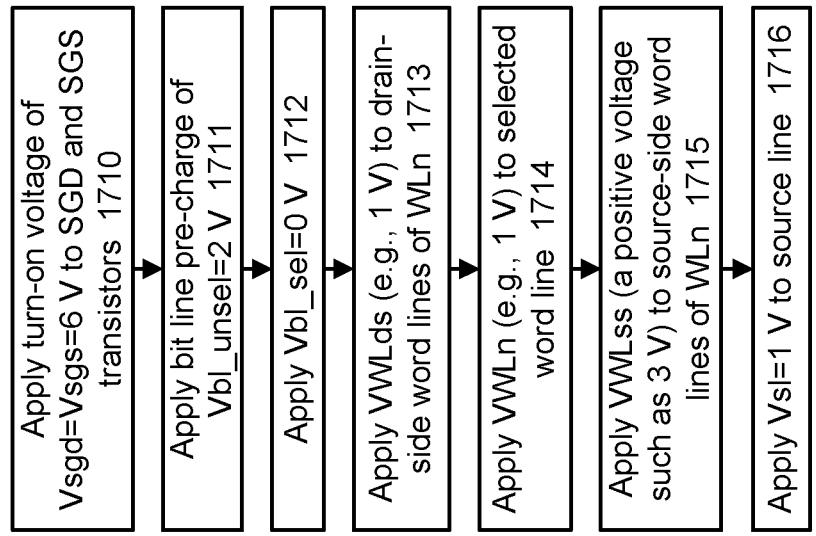
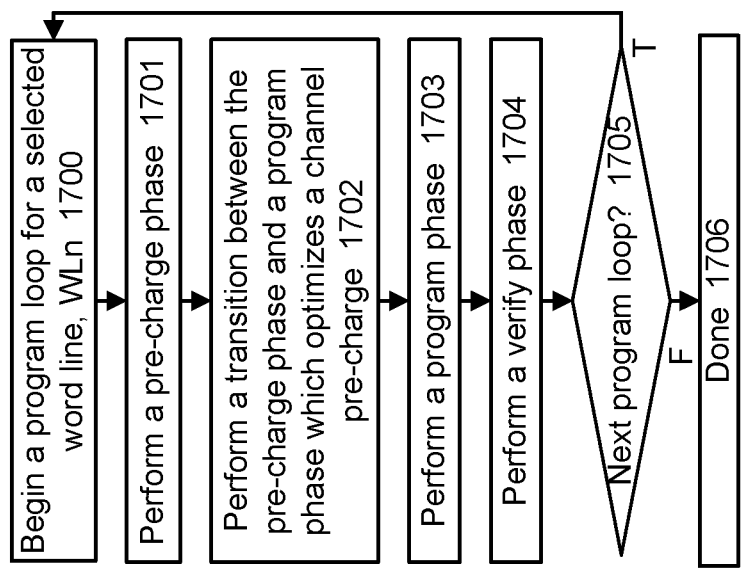

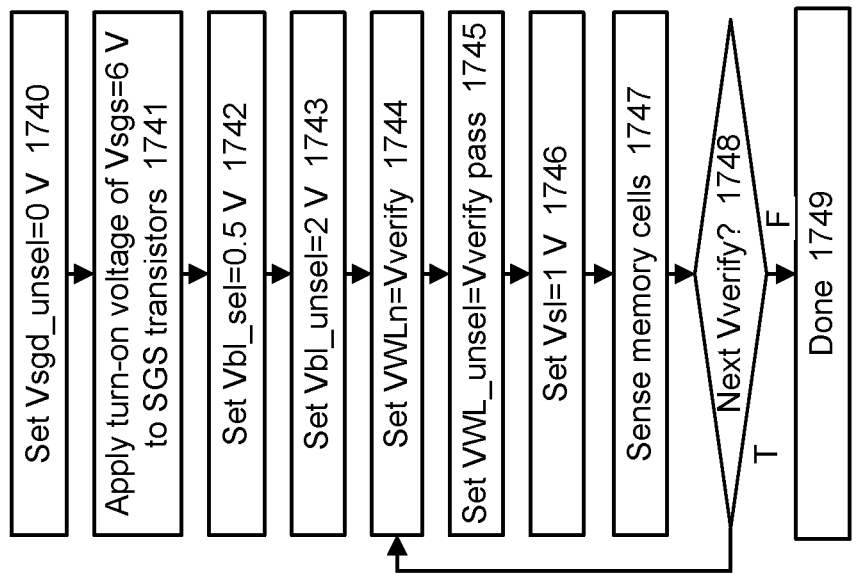
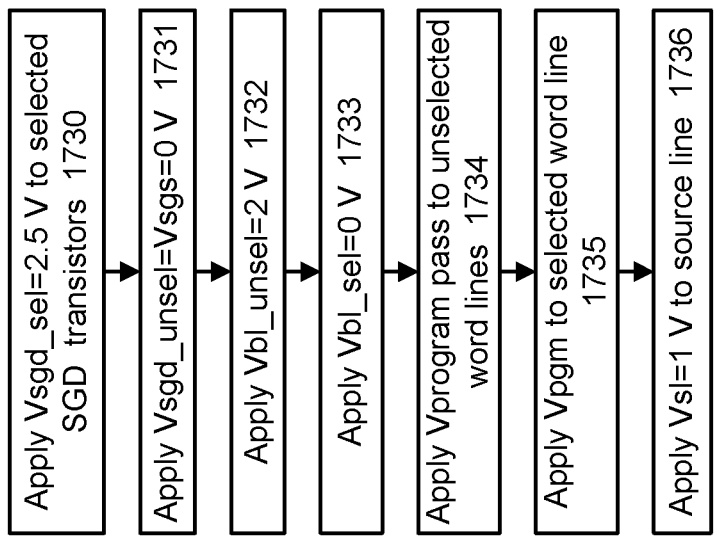

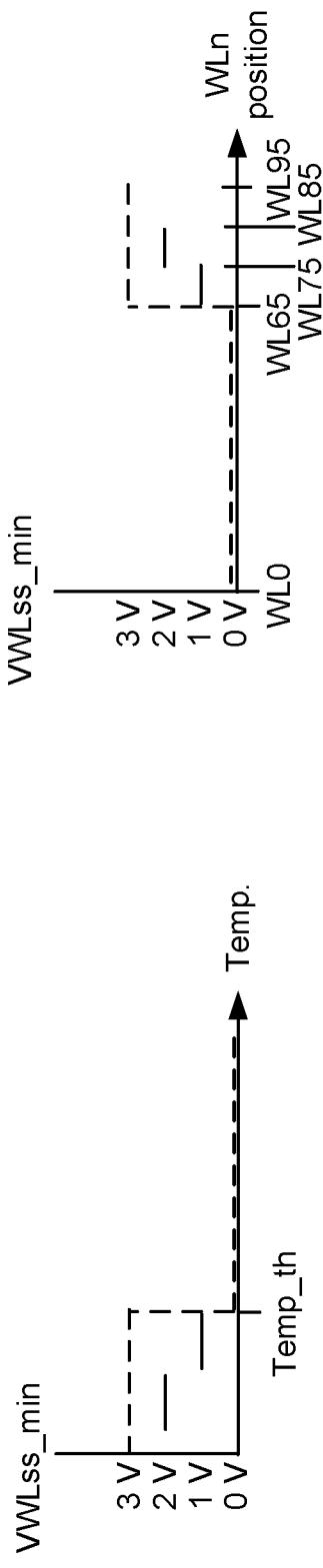
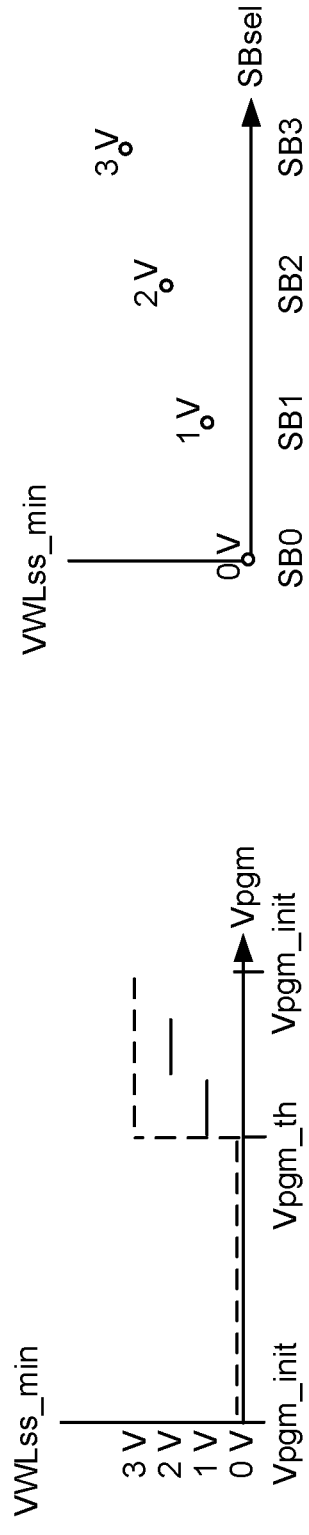
Fig. 19A
Fig. 19B
Fig. 19C
Fig. 19D

US 10,790,003 B1

MAINTAINING CHANNEL PRE-CHARGE IN PROGRAM OPERATION

BACKGROUND

The present technology relates to the operation of storage and memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings (e.g., NAND chains), for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 1B depicts an example of the temperature-sensing circuit 116 of FIG. 1A.

FIG. 6B depicts a close-up view of the region 622 of the stack of FIG. 6A.

FIG. 8A depicts example Vth distributions of a set of memory cells with three bits per cell and eight data states.

FIG. 8B depicts example Vth distributions of a set of memory cells with four bits per cell and sixteen data states.

FIG. 9A depicts an example voltage signal used in a program operation, consistent with FIG. 8A.

FIG. 9B depicts an example of verify voltages used in different program loops of FIG. 9A.

FIG. 10A depicts a NAND string and corresponding channel regions in an example configuration during a pre-charge phase, where VWLss=3 V, VWLn=1 V and VWLds=1 V.

FIG. 10B depicts channel voltages consistent with FIG. 10A.

FIG. 12A depicts a NAND string and corresponding channel regions in a second example configuration during a transition period, where VWLss remains at 3 V for WLn−1 to WLn−3, and VWLss=3→0 V for remaining source side word lines.

FIG. 12B depicts channel voltages consistent with FIG. 12A.

FIG. 13A depicts a NAND string and corresponding channel regions in a third example configuration during a transition period, where VWLss remains at 3 V for WLn−1, VWLss=3→2 V for WLn−2, VWLss=3→1 V for WLn−3, and VWLss=3→0 V for remaining source side word lines.

FIG. 13B depicts channel voltages consistent with FIG. 13A.

FIG. 14A depicts a NAND string and corresponding channel regions in a fourth example configuration during a transition period, where VWLss=3→2 V for WLn−1 to WLn−3, and VWLss=3→0 V for remaining source side word lines.

FIG. 14B depicts channel voltages consistent with FIG. 14A.

FIG. 15A depicts a NAND string and corresponding channel regions in a fifth example configuration during a transition period, where VWLss remains at 3 V for WLn−1 to WLn−3, the associated memory cells are in the erased state, and VWLss=3→0 V for remaining source side word lines.

FIG. 15B depicts channel voltages consistent with FIG. 15A.

FIG. 16A depicts a NAND string and corresponding channel regions in a seventh example configuration during a transition period, where VWLss remains at 3 V for WLn−1 to WLn−3, the associated memory cells of WLn−1 and WLn−2 are in the erased state, the associated memory cell of WLn−3 is in the G state, and VWLss=3→0 V for remaining source side word lines.

FIG. 16B depicts channel voltages consistent with FIG. 16A.

FIG. 17A depicts a flowchart of an example process for performing a program operation.

FIG. 17B depicts a flowchart of an example process for performing the pre-charge phase of step 1701 of FIG. 17A.

FIG. 17D depicts a flowchart of an example process for performing the program phase of step 1703 of FIG. 17A.

FIG. 17E depicts a flowchart of an example process for performing the verify phase of step 1704 of FIG. 17A.

FIG. 19A depicts an example plot of VWLss_min versus temperature (Temp.).

FIG. 19B depicts an example plot of VWLss_min versus the position of WLn.

FIG. 19C depicts an example plot of VWLss_min versus Vpgm.

FIG. 19D depicts an example plot of VWLss_min versus a selected sub-block, SBsel.

DETAILED DESCRIPTION

Apparatuses and techniques are described for maintaining a channel pre-charge in a program operation, and to reducing a likelihood of program disturb.

In some memory devices, memory cells are joined to one another such as in NAND strings in a block or sub-block. Each NAND string comprises a number of memory cells connected in series between one or more drain-end select gate transistors (referred to as SGD transistors), on a drain-end of the NAND string which is connected to a bit line, and one or more source-end select gate transistors (referred to as SGS transistors), on a source-end of the NAND string or other memory string or set of connected memory cells, which is connected to a source line. Further, the memory cells can be arranged with a common control gate line (e.g., word line) which acts a control gate. A set of word lines extends from the source-side of a block to the drain-side of a block. Memory cells can be connected in other types of strings and in other ways as well.

In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells. In a 2D memory structure, the memory cells may be arranged in horizontal NAND strings on a substrate.

Figure 7:
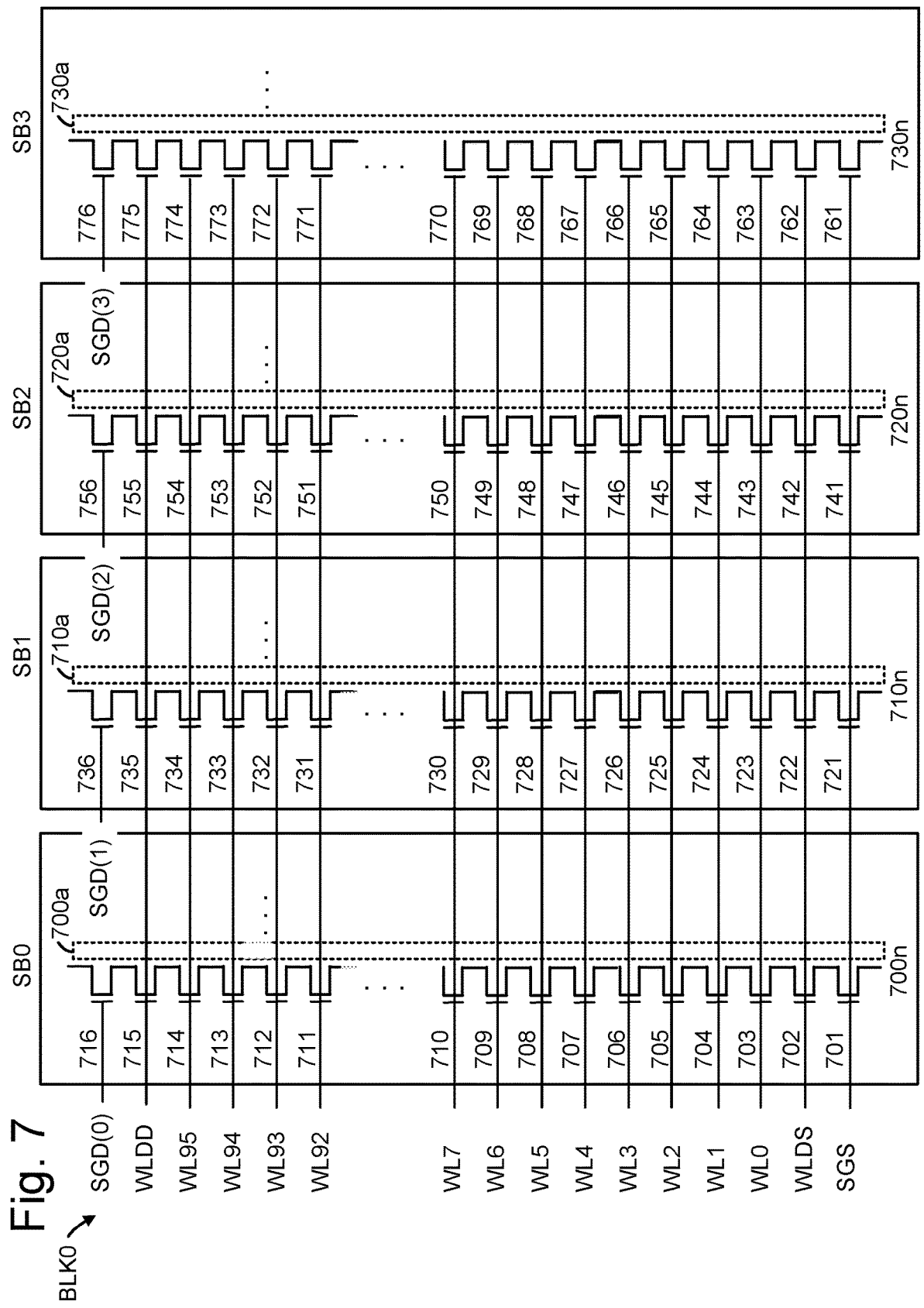
FIG. 7 depicts an example view of NAND strings in a block BLK0 which is consistent with FIGS. 4 and 6A.

After a block of memory cells is erased in an erase operation, programming can occur. During a programming operation, the memory cells are programmed according to a word line programming order. For example, the programming may start at the word line at the source-side of the block and proceed to the word line at the drain-side of the block, one word line at a time. A word line can also be programmed in a sub-block programming order, extending from SB0 to SB3, for example, when there are four sub-block (FIG. 7). For example, a portion of the memory cells of WLn in SB0 are first programmed, followed by a portion of the memory cells of WLn in SB1, a portion of the memory cells of WLn in SB2 and then a portion of the memory cells of WLn in SB3. A programming operation may include one or more sets of increasing program voltages or pulses which are applied to a word line in respective program loops or program-verify iterations, such as depicted in FIGS. 9A and 9B. Verify tests may be performed after each program voltage to determine whether the memory cells have completed programming. When programming is completed for a memory cell, it can be locked out from further programming while programming continues for other memory cells in subsequent program loops.

Each memory cell may be associated with a data state according to write data in a program command. Based on its data state, a memory cell will either remain in the erased (Er) state or be programmed to a programmed data state. For example, in a one bit per cell memory device, there are two data states including the erased state and the programmed state. In a two-bit per cell memory device, there are four data states including the erased state and three programmed data states referred to as the A, B and C data states. In a three-bit per cell memory device, there are eight data states including the erased state and seven programmed data states referred to as the A, B, C, D, E, F and G data states (see FIG. 8A). In a four-bit per cell memory device, there are sixteen data states including the erased state S0 and fifteen programmed data states S1-S15 (see FIG. 8B). Each data state can be represented by a range of threshold voltages (Vth) in the memory cells.

After the memory cells are programmed, the data can be read back in a read operation. A read operation can involve applying a series of read voltages to a word line while sensing circuitry determines whether cells connected to the word line are in a conductive (turned on) or non-conductive (turned off) state. If a cell is in a non-conductive state, the Vth of the memory cell exceeds the read voltage. The read voltages are set at levels which are expected to be between the threshold voltage levels of adjacent data states. Moreover, during the read operation, the voltages of the unselected word lines are ramped up to a read pass level or turn on level which is high enough to place the unselected memory cells in a strongly conductive state, to avoid interfering with the sensing of the selected memory cells. A word line which is being programmed or read is referred to as a selected word line, WLn.

Figure 18:
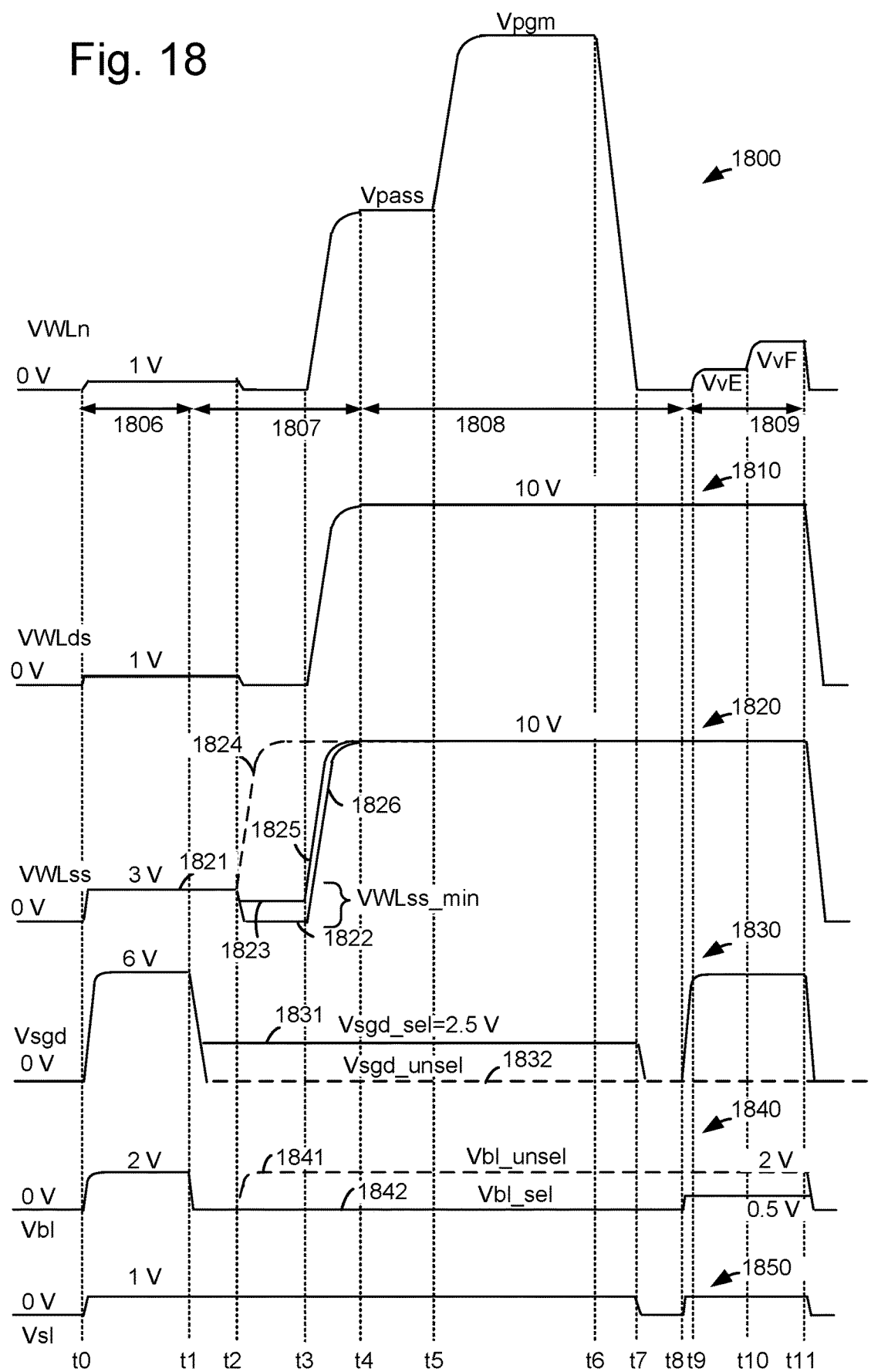
FIG. 18 depicts example voltage signals for performing the process of FIG. 17A.

A program loop can include a pre-charge phase 1806, a transition period 1807, a program phase 1808 and a verify phase 1809, as depicted in FIG. 18. In the pre-charge phase, a positive voltage is applied to the channels of the unselected NAND strings via the bit lines. At the same time, a positive voltage is applied to the word lines to allow the voltage to pass in the channel. A goal is to provide a small voltage in the channel which can be boosted higher in the subsequent program phase, when the word line voltages increase to a pass voltage. However, the channel boosting can be degraded in the transition period, when the word line voltages decrease. The degradation is due to the creation of a large channel gradient (see, e.g., plot 1141 in FIG. 11B) which generates electron-hole pairs, where the electrons 1145 can pull down the channel boosting level, especially on the drain side of the selected word line. The channel gradient is between the selected word line WLn and the adjacent source side word line WLn−1.

Techniques provided herein address the above and other issues. In one approach, the word line voltages of a group of one or more source side word lines adjacent to the selected word line are increased directly from the level used during pre-charge phase to a pass voltage. This reduces the channel gradient between WLn and WLn−1. See, e.g., FIG. 12B. The word line voltages of other source side word lines, and of drain side word lines, can be decreased and then increased to the pass voltage to provide a large voltage swing which couples up the channel in the program phase.

The voltages of the source side word lines can be adjusted based on a risk of program disturb. Risk factors such as temperature, WLn position, Vpgm and the selected sub-block position in a sub-block programming order, can be considered. The risk of program disturb is greater when the temperature is lower, the WLn position is further from the source side of the NAND strings, Vpgm is higher and when there is a relatively large number of sub-blocks which are programmed before the selected sub-block. See FIG. 19A-19D.

In one approach, the voltages of a group of one or more source side word lines are increased directly from a respective positive voltage in the pre-charge phase to the pass voltage when the risk of program disturb is high, and decreased from the respective positive voltage in the pre-charge phase to a minimum voltage such as 0 V and then increased from the minimum voltage to the pass voltage when the risk of program disturb is low.

In one approach, the voltages of a group of one or more source side word lines are decreased to different levels to provide a gradual transition in the channel gradient. See, e.g., FIGS. 13A and 13B.

The techniques can be used separately or combined.

These and other features are discussed further below.

Figure 1A:
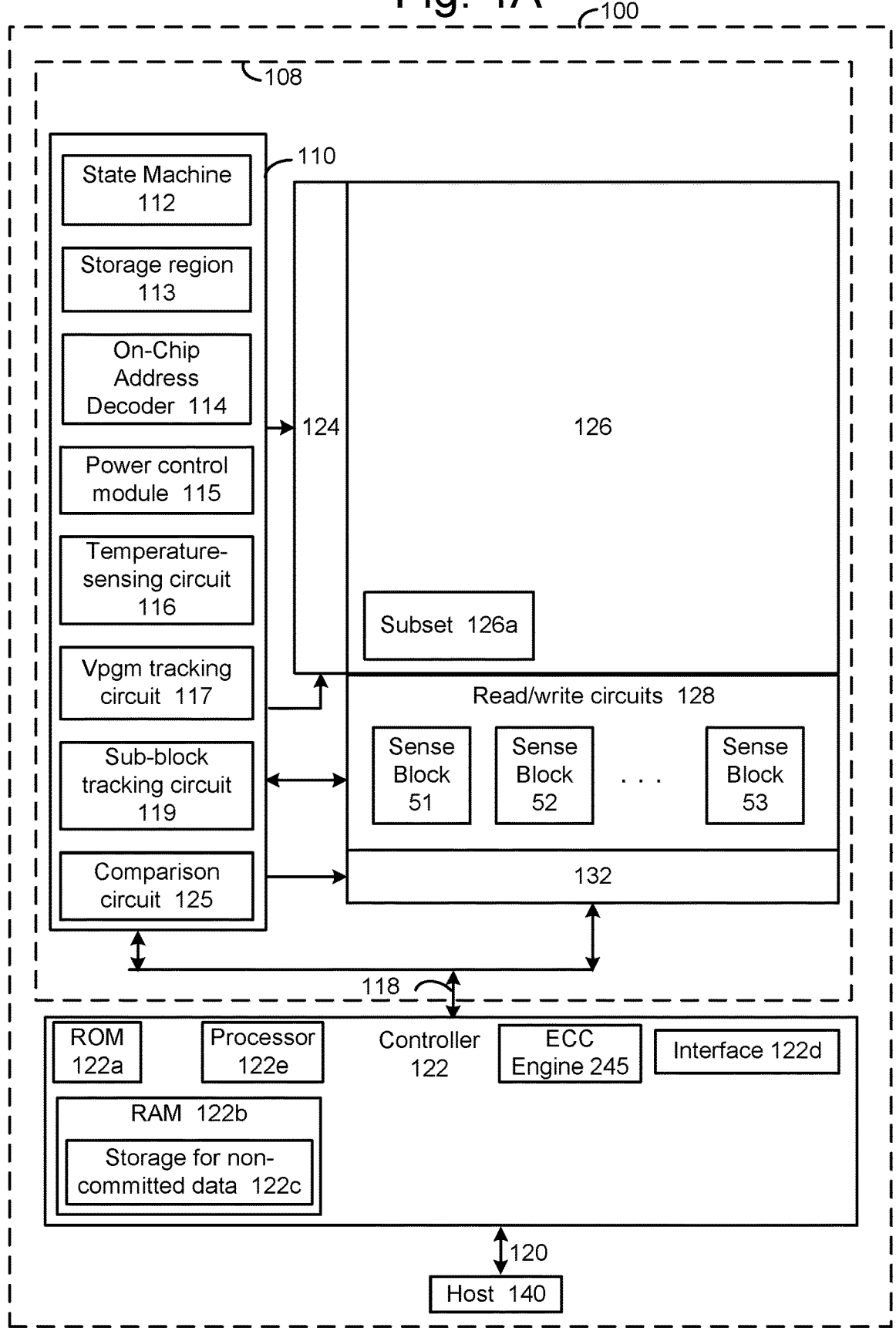
FIG. 1A is a block diagram of an example storage device.

FIG. 1A is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine, an on-chip address decoder 114, a power control module 115 (power control circuit), a temperature-sensing circuit 116, a Vpgm tracking circuit 117, a sub-block tracking circuit 119 and a comparison circuit 125. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach. The temperature-sensing circuit 116 can detect a temperature of the memory device at the time of a program operation, for example, for use by the comparison circuit. The Vpgm tracking circuit 117 can track the magnitude of Vpgm or detect when Vpgm reaches a threshold. The program loop could also be tracked, since it typically corresponds to Vpgm. The sub-block tracking circuit 119 can track the currently selected sub-block being programmed.

The comparison circuit 125 can store threshold values of temperature, program voltage, sub-block number and word line position, and compare these threshold values to the current temperature, program voltage, sub-block number and word line position, respectively, to determine a risk of program disturb and a corresponding countermeasure in the transition period between the pre-charge phase and the program phase, consistent with FIG. 19A-19D. The comparison circuit can receive the temperature from the circuit 116, the program voltage from the circuit 117, the sub-block number from the circuit 119 and the word line position from the state machine 112 and make a decision as to the strength of a program disturb countermeasure, or whether to use a program disturb countermeasure, for instance. The temperature, program voltage, sub-block number and word line position are examples of risk factors for program disturb.

See FIG. 1B for an example implementation of the temperature-sensing circuit. The temperature-sensing circuit, Vpgm tracking circuit, sub-block tracking circuit, and comparison circuit may include hardware, software and/or firmware for performing the processes described herein.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 115, temperature-sensing circuit 116, Vpgm tracking circuit 117, sub-block tracking circuit 119, comparison circuit 125, sense blocks 51, 52, . . . , 53, read/write circuits 128, controller 122, and so forth.

The off-chip controller 122 (which in one embodiment is an electrical circuit) may comprise a processor 122e, memory such as ROM 122a and RAM 122b and an error-correction code (ECC) engine 245. The ECC engine can correct a number of read errors. The RAM 122b can be a DRAM which includes a storage location 122c for non-committed data. During programming, a copy of the data to be programmed is stored in the storage location 122c until the programming is successfully completed. In response to the successful completion, the data is erased from the storage location and is committed or released to the block of memory cells. The storage location 122c may store one or more word lines of data.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The memory in the controller 122, such as such as ROM 122a and RAM 122b, comprises code such as a set of instructions, and the processor is operable to execute the set of instructions to provide the functionality described herein. Alternatively or additionally, the processor can access code from a subset 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or the subset 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable m devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B depicts an example of the temperature-sensing circuit 116 of FIG. 1A. The circuit includes pMOSFETs 131a, 131b and 134, bipolar transistors 133a and 133b and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor 122e. This is data indicating a temperature of the memory device. ROM fuses 123 store data which correlates the matching voltage level to a temperature, in one approach. The processor then uses the temperature to set temperature-based parameters in the memory device such as by using the comparison circuit.

Vbg, is obtained by adding the base-emitter voltage (Vbe) across the transistor 131b and the voltage drop across the resistor R2. The bipolar transistor 133a has a larger area (by a factor N) than the transistor 133b. The PMOS transistors 131a and 131b are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131a and 131b and the current through the transistor 134 mirrors the current through the transistors 131a and 131b.

Figure 2:
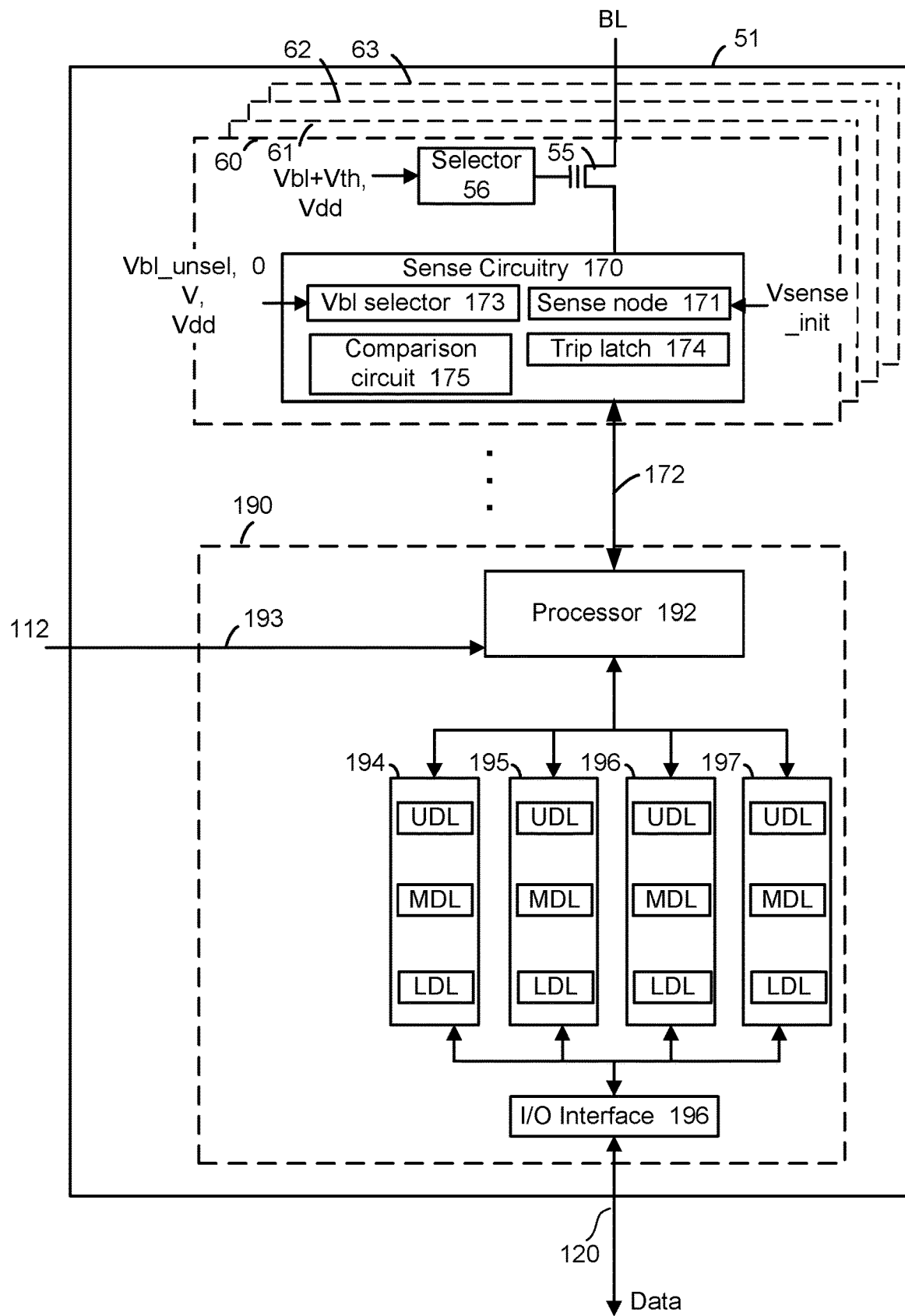
FIG. 2 is a block diagram depicting one embodiment of the sense block 51 of FIG. 1A.

FIG. 2 is a block diagram depicting one embodiment of the sense block 51 of FIG. 1. An individual sense block 51 is partitioned into one or more core portions, referred to as sense circuits 60-63 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements (memory cells).

The sense circuit 60, as an example, comprises sense circuitry 170 that performs sensing by determining whether a conduction current in a connected bit line is above or below a predetermined threshold level. The sensing can occur in a read or verify operation. The sense circuit also supplies a bit line voltage during the application of a program voltage in a program operation.

The sense circuitry may include a Vbl selector 173, a sense node 171, a comparison circuit 175 and a trip latch 174. During the application of a program voltage, the Vbl selector 173 can pass Vbl_unsel (e.g., 2 V) to a bit line connected to a memory cell which is inhibited from programmed, or 0 V to a bit line connected to a memory cell which is being programmed in the current program loop. A transistor 55 (e.g., an nMOS) can be configured as a pass gate to pass Vbl from the Vbl selector 173, by setting the control gate voltage of the transistor sufficiently high, e.g., higher than the Vbl passed from the Vbl selector. For example, a selector 56 may pass a power supply voltage Vdd, e.g., 3-4 V to the control gate of the transistor 55.

During sensing operations such as read and verify operations, the bit line voltage is set by the transistor 55 based on the voltage passed by the selector 56. The bit line voltage is roughly equal to the control gate voltage of the transistor minus its Vth (e.g., 1 V). For example, if Vbl+Vth is passed by the selector 56, the bit line voltage will be Vbl. This assumes the source line is at 0 V. The transistor 55 clamps the bit line voltage according to the control gate voltage and acts a source-follower rather than a pass gate. The Vbl selector 173 may pass a relatively high voltage such as Vdd which is higher than the control gate voltage on the transistor 55 to provide the source-follower mode. During sensing, the transistor 55 thus charges up the bit line.

In one approach, the selector 56 of each sense circuit can be controlled separately from the selectors of other sense circuits, to pass Vbl or Vdd. The Vbl selector 173 of each sense circuit can also be controlled separately from the Vbl selectors of other sense circuits During sensing, the sense node 171 is charged up to an initial voltage such as 3 V. The sense node is then connected to the bit line via the transistor 55, and an amount of decay of the sense node is used to determine whether a memory cell is in a conductive or non-conductive state. The comparison circuit 175 is used to compare the sense node voltage to a trip voltage at a sense time. If the sense node voltage decays below the trip voltage Vtrip, the memory cell is in a conductive state and its Vth is at or below the voltage of the verification signal. If the sense node voltage does not decay below Vtrip, the memory cell is in a non-conductive state and its Vth is above the voltage of the verification signal. The sense circuit 60 includes a trip latch 174 that is set by the comparison circuit 175 based on whether the memory cell is in a conductive or non-conductive state. The data in the trip latch can be a bit which is read out by the processor 192.

The managing circuit 190 comprises a processor 192, four example sets of data latches 194-197 and an I/O Interface 196 coupled between the set of data latches 194 and data bus 120. One set of three data latches, e.g., comprising individual latches LDL, MDL and UDL, can be provided for each sense circuit. In some cases, a different number of data latches may be used. In a three bit per cell embodiment, LDL stores a bit for a lower page of data, MDL stores a bit for a middle page of data and UDL stores a bit for an upper page of data.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. For three bits per cell, an MDL or UDL latch is flipped when a middle or upper page bit, respectively, is stored in an associated memory cell. This occurs when an associated memory cell completes programming.

Figure 3:
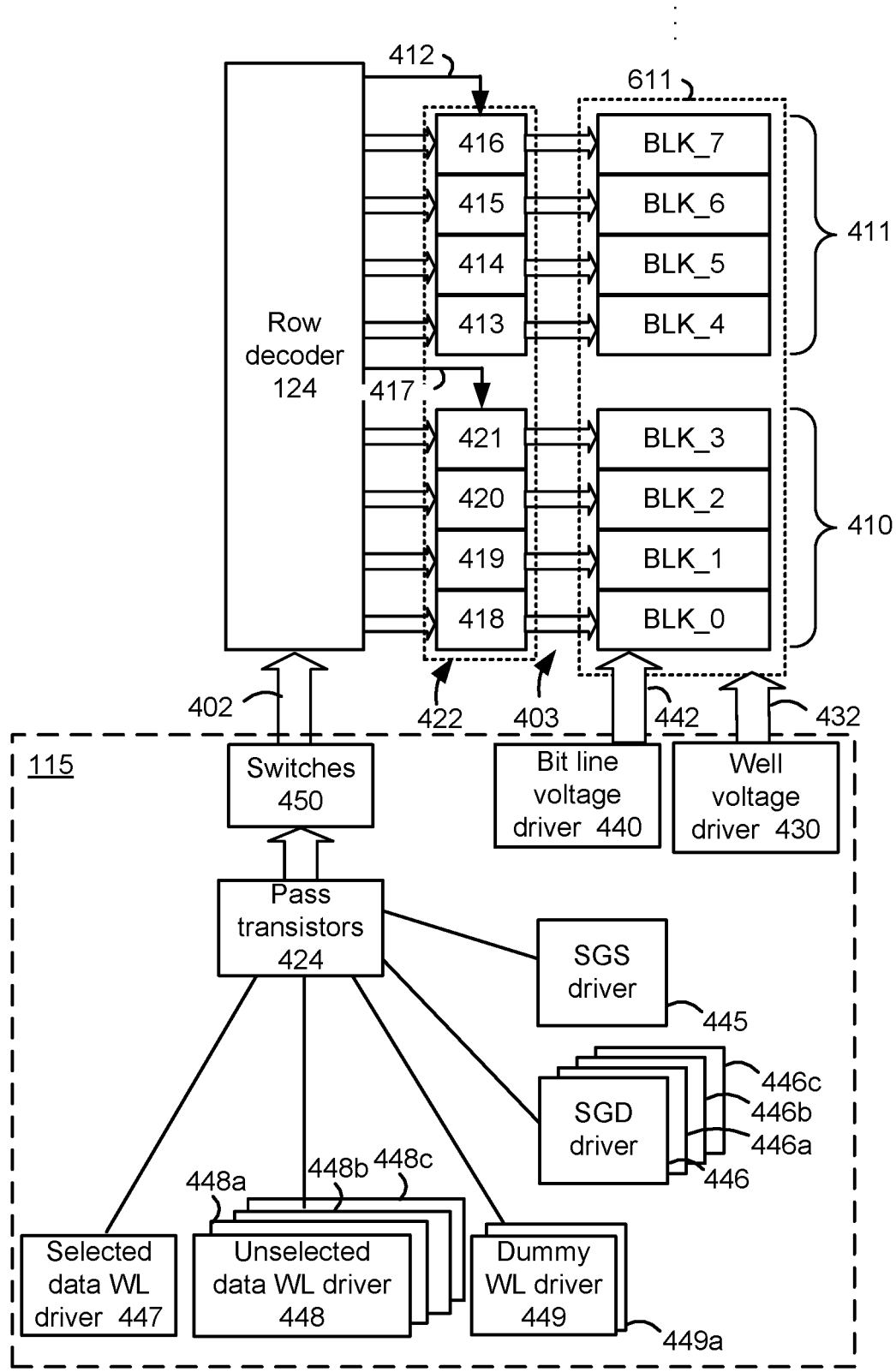
FIG. 3 depicts an example implementation of the power control module 115 of FIG. 1A for providing voltages to blocks of memory cells.

FIG. 3 depicts an example implementation of the power control module 115 of FIG. 1A for providing voltages to blocks of memory cells. In this example, the memory structure 126 includes a set 410 of four related blocks, BLK_0 to BLK_3, and another set 411 of four related blocks, BLK_4 to BLK_7. The blocks can be in one or more planes. The row decoder 124 of FIG. 1A provides voltages to word lines and select gates of each block via pass transistors 422. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 412 is connected to sets of pass transistors 413, 414, 415 and 416, which in turn are connected to control gate lines of BLK_4, BLK_5, BLK_6 and BLK_7, respectively. A control gate line 417 is connected to sets of pass transistors 418, 419, 420 and 421, which in turn are connected to control gate lines of BLK_0, BLK_1, BLK_2 and BLK_3, respectively.

Typically, program or read operations are performed on one selected block at a time and on one selected sub-block of the block. An erase operation may be performed on a selected block or sub-block. The row decoder can connect global control lines 402 to local control lines 403. The control lines represent conductive paths. Voltages are provided on the global control lines from a number of voltage drivers. Some of the voltage drivers may provide voltages to switches 450 which connect to the global control lines. Pass transistors 424 are controlled to pass voltages from the voltage drivers to the switches 450.

The voltage drivers can include a selected data word line (WL) driver 447, which provides a voltage on a data word line selected during a program or read operation. The driver 447 can provide a pre-charge voltage Vpch_n on WLn. Drivers 448, 448a, 448b and 448c can be used for unselected data word lines, and dummy word line drivers 449 and 449a can be used to provide voltages on dummy word lines WLDD and WLDS, respectively, in FIG. 6A. For example, the driver 448 can be used to apply voltages, including the pre-charge voltage Vpch_ds, to the drain-side unselected word lines and the driver 448a-448c can be used to apply voltages, including the pre-charge voltage Vpch_ss, to the source-side unselected word lines.

The voltage drivers can also include separate SGD drivers for each sub-block. For example, SGD drivers 446, 446a, 446b and 446c can be provided for SB0, SB1, SB2 and SB3, respectively, such as in FIG. 7. In one option, an SGS driver 445 is common to the different sub-blocks in a block.

The various components, including the row decoder, may receive commands from a controller such as the state machine 112 or the controller 122 to perform the functions described herein.

The well voltage driver 430 provides a voltage Vsl to the well region 611b (FIG. 6A) in the substrate, via control lines 432. The well voltage driver 430 is one example of a source line driver, where the well region 611b is a source line, e.g., a conductive path connected to the source ends of the NAND strings. In one approach, the well region 611a is common to the blocks. A set of bit lines 442 is also shared by the blocks. A bit line voltage driver 440 provides voltages to the bit lines. In a stacked memory device such as depicted in FIG. 4 to 8B, sets of connected memory cells may be arranged in NAND strings which extend vertically upward from the substrate. The bottom (or source end) of each NAND string is in contact with the substrate, e.g., the well region, and the top end (or drain end) of each NAND string is connected to a respective bit line, in one approach.

Figure 4:
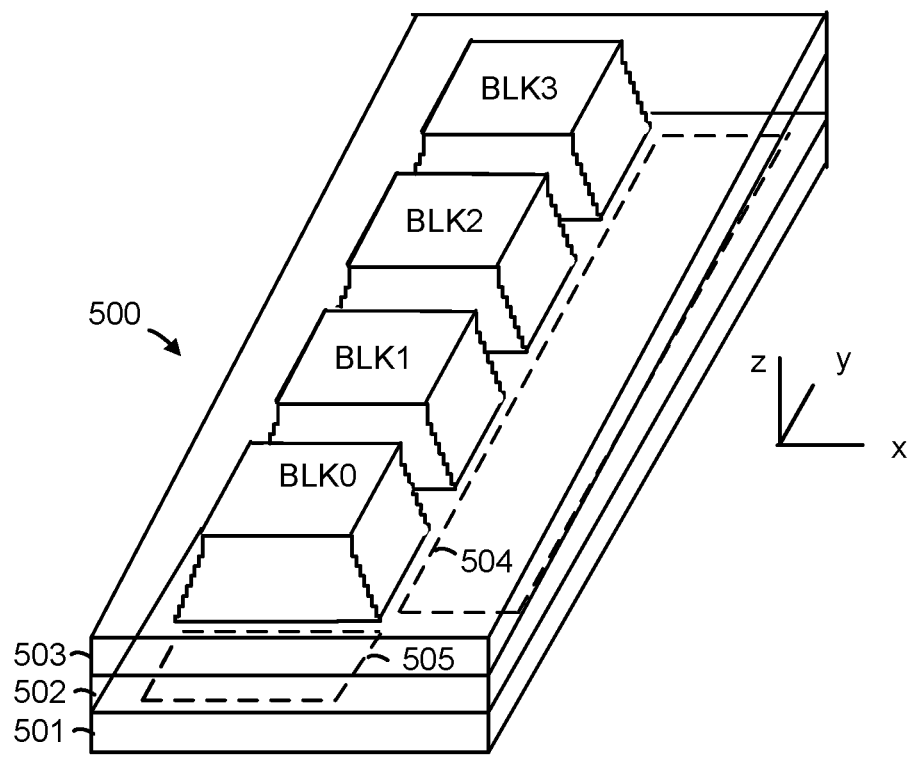
FIG. 4 is a perspective view of a memory device 500 comprising a set of blocks in an example 3D configuration of the memory structure 126 of FIG. 1A.

FIG. 4 is a perspective view of a memory device 500 comprising a set of blocks in an example 3D configuration of the memory structure 126 of FIG. 1. On the substrate are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 5:
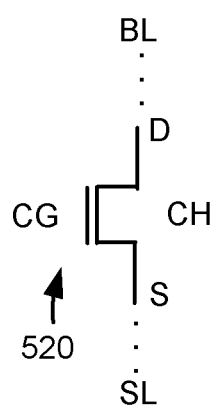
FIG. 5 depicts an example transistor 520.
Figure 6A:
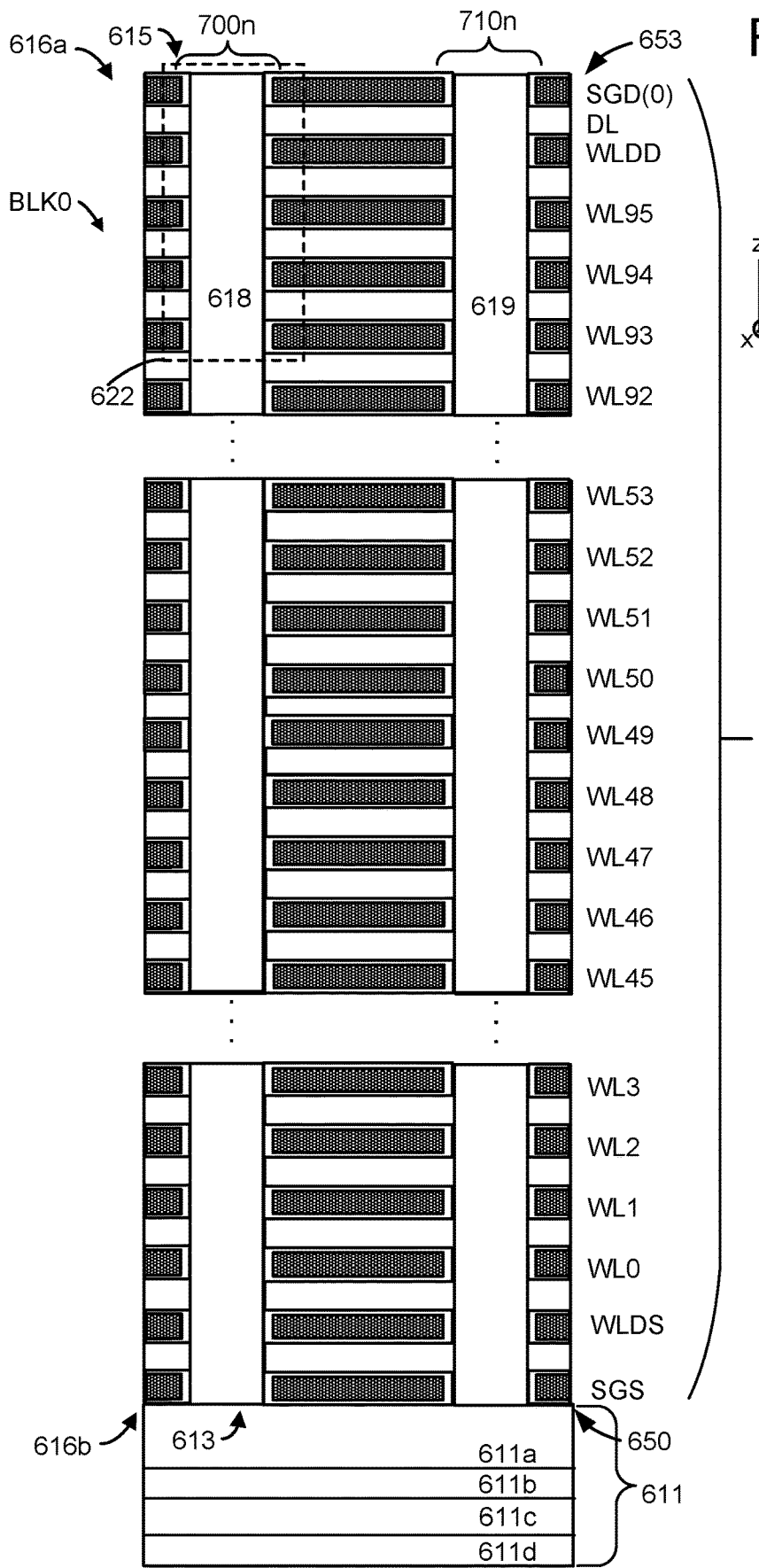
FIG. 6A depicts an example cross-sectional view of a portion of BLK0 of FIG. 4, including NAND strings 700n and 710n.

FIG. 5 depicts an example transistor 520. The transistor comprises a control gate CG, a drain D, a source S and a channel CH and may represent a memory cell or a select gate transistor, for example. The drain end of the transistor is connected to a bit line BL optionally via one or more other transistors in a NAND string, and the source end of the transistor is connected to a source line SL optionally via one or more other transistors in a NAND string, FIG. 6A depicts an example cross-sectional view of a portion of BLK0 of FIG. 4, including NAND strings 700n and 710n. In this example, the NAND strings 700n and 710n are in different sub-blocks. The block comprises a stack 610 of alternating conductive layers (word line layers) and dielectric layers. The layers may be rectangular plates having a height in the z direction, a width in the y direction, and a length in the x direction.

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS, WL0-WL95, WLDD and SGD(0). WLDS and WLDD are dummy word lines or conductive layers connected to dummy memory cells, which are ineligible to store user data. A dummy memory cell may have the same construction as a data memory cell but is considered by the controller to be ineligible to store any type of data including user data. One or more dummy memory cells may be provided at the drain and/or source ends of a NAND string of memory cells to provide a gradual transition in the channel voltage gradient. WL0-WL95 are data word lines connected to data memory cells, which are eligible to store user data. As an example only, the stack includes ninety-six data word lines. DL is an example dielectric layer.

A top 653 and bottom 650 of the stack are depicted. WL95 is the topmost data word line or conductive layer and WL0 is the bottommost data word line or conductive layer.

The NAND strings each comprise a memory hole 618 or 619, respectively, which is filled with materials which form memory cells adjacent to the word lines. For example, see region 622 of the stack which is shown in greater detail in FIG. 6B.

The stack is formed on a substrate 611. In one approach, a well region 611a (see also FIG. 3) is an n-type source diffusion layer or well in the substrate. The well region is in contact with a source end of each string of memory cells in a block. The n-type well region 611a in turn is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach, and form a source line SL which provides a voltage to a source end of each NAND string in a block.

The NAND string 700n has a source end 613 at a bottom 616b of the stack 610 and a drain end 615 at a top 616a of the stack. Metal-filled slits may be provided periodically across the stack as local interconnects which extend through the stack, such as to connect the source line to a line above the stack. The slits may be used during the formation of the word lines and subsequently filled with metal. Vias may be connected at one end to the drain ends of the NAND strings and at another end to a bit line.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

FIG. 6B depicts a close-up view of the region 622 of the stack of FIG. 6A. Memory cells are formed at the different levels of the stack at the intersection of a word line layer and a memory hole. An SGD transistor 716 connected to SGD (0), a dummy memory cell 715 connected to WLDD and data memory cells 712-714 connected to WL93-WL95, respectively, are depicted.

A number of layers can be deposited along the sidewall (SW) of the memory hole 629 and/or within each word line layer, e.g., using atomic layer deposition. For example, each pillar 685 or column which is formed by the materials within a memory hole can include a blocking oxide layer 663, a charge-trapping layer 664 or film such as silicon nitride (Si3N4) or other nitride, a tunneling layer 665 (e.g., a gate oxide), a channel 660 (e.g., comprising polysilicon), and a dielectric core 666 (e.g., comprising silicon dioxide). A word line layer can include a metal barrier 661 and a conductive metal 662 such as Tungsten as a control gate. For example, control gates 690-694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each NAND string or set of connected transistors comprises a channel which extends continuously from one or more source-end select gate transistors to one or more drain-end select gate transistors. For example, the channels 700a, 710a, 720a and 730a extend continuously in the NAND strings 700n, 710n, 720n and 730n, respectively, from the source end to the drain end of each NAND string.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. See FIG. 6C-6F. During an erase operation, the electrons return to the channel.

While the above example is directed to a 3D memory device with vertically extending NAND strings, the techniques provided herein are also applicable to a 2D memory device in which the NAND strings extend horizontally on a substrate. Both 2D and 3D NAND strings may have a polysilicon channel with grain boundary traps. Moreover, the techniques may be applied to memory devices with other channel materials as well.

Note that the techniques described herein for using a state machine to implement different modes are compatible with various types of memory device including the 3D memory device of FIG. 4-7 and a 2D memory device.

FIG. 7 depicts an example view of NAND strings in the block BLK0 which is consistent with FIGS. 4 and 6A. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 6A. Each sub-block comprises a set of NAND strings which extend in the x direction and which have a common SGD line or control gate layer. The NAND strings 700n, 710n, 720n and 730n are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB2, then programming WL1 in SB0, SB1, SB2 and then SB2, and so forth. The word line programming order may start at WL0, the source-end word line and end at WL95, the drain-end word line, for example.

The NAND strings 700n, 710n, 720n and 730n have channels 700a, 710a, 720a and 730a, respectively. Additionally, NAND string 700n includes SGS transistor 701, dummy memory cell 702, data memory cells 703-714, dummy memory cell 715 and SGD transistor 716. NAND string 710n includes SGS transistor 721, dummy memory cell 722, data memory cells 723-734, dummy memory cell 735 and SGD transistor 736. NAND string 720n includes SGS transistor 741, dummy memory cell 742, data memory cells 743-754, dummy memory cell 755 and SGD transistor 756. NAND string 730n includes SGS transistor 761, dummy memory cell 762, data memory cells 763-774, dummy memory cell 775 and SGD transistor 776.

This example depicts one SGD transistor at the drain-end of each NAND string, and one SGS transistor at the source-end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

FIG. 8A depicts example Vth distributions of a set of memory cells with three bits per cell and eight data states. The vertical axis depicts a number of memory cells on a logarithmic scale, and the horizontal axis depicts a Vth of the memory cells on a linear scale. In one approach, at a start of a program operation, the memory cells are all initially in the erased (Er) state, as represented by the Vth distribution 800. After the program operation is successfully completed, the memory cells assigned to the A-G states are represented by the Vth distributions 801-807. The memory cells assigned to the lower states including the erased state may experience program disturb so that they are represented by the Vth distribution 800a, for example for the Er state, with an upshifted upper tail.

The memory cells which are programmed to the A-G states using verify voltages of VvA-VvG, respectively, are represented by the Vth distributions 801-807, respectively. These Vth distributions are obtained just after completion of the program operation, and assume no program disturb or neighbor word line interference has occurred. The verify voltages are used in the program-verify tests of the memory cells. Read voltages VrA-VrG can be used for reading the states of the memory cells in a read operation. The verify voltages and read voltages are examples of program parameters for three-bit per cell operations.

In an erase operation, the data memory cells transition from the Vth distributions of the programmed data states, e.g., states A-G, to the erased state. The erase operation includes an erase phase in which the memory cells are biased for erasing followed by an erase-verify test. The erase-verify test can use an erase-verify voltage, VvEr, which is applied to the word lines.

The Er-G states are examples of assigned data states, and the A-G states are examples of programmed data states, in this eight state example. The number of data states could be higher or low than eight data states.

FIG. 8B depicts example Vth distributions of a set of memory cells with four bits per cell and sixteen data states. The Vth distribution 810 is for the erased state S0 and the Vth distributions 811-825 are for the programmed data states S1-S15, respectively, which have corresponding verify voltages VvS1-VvS15, respectively. The erased state has an erase-verify voltage VvS0. Read voltages VrS1-VrS15 are also depicted.

The memory cells may experience program disturb, which is not depicted for simplicity.

FIG. 9A depicts an example voltage signal used in a program operation, consistent with FIG. 8A. The voltage signal 900 includes a set of program voltages, including an initial program voltage 901, which are applied to a word line selected for programming. The initial program voltage is represented by Vpgm_init and dVpgm denotes the step size. A single program pass is used having 22 program loops, as an example. The verification signals in each program loop, including example verification signals 902, can encompass lower assigned data states, then midrange assigned data states and then higher assigned data states as the program operations proceeds, as depicted in FIG. 9B.

The example verification signals depict three verify voltages as a simplification. As used herein, a verification signal comprises a signal which is applied to a selected word line during a program loop after the application of a program voltage to the selected word line. The verification signal is part of a sensing operation. Memory cells are sensed during the application of the verification signal to judge their programming progress. A verification signal includes one or more voltages which are used to judge whether the memory cell has completed programming to an assigned data state. The result of sensing of the Vth relative to a verify voltage can be used to inhibit further programming of a memory cell.

The data which is programmed or read can be arranged in pages. For example, with two bits per cell, two pages of data can be stored in the memory cells connected to a word line. The data of the lower and upper pages can be determined by reading the memory cells using read voltages of VrA and VrC; and VrB, respectively.

With three bits per cell, three pages of data can be stored in the memory cells connected to a word line. The data of the lower, middle and upper pages can be determined by reading the memory cells using read voltages of VrA and VrE; VrB; and VrC and VrG, respectively.

FIG. 9B depicts an example of verify voltages used in different program loops of FIG. 9A. The horizontal bars are time-aligned with the program loop axis of FIG. 9A. The bars overlap in some program loops, indicating that verify operations can be performed for multiple data states in the program loop. With eight data states, the bars indicate that verify voltages for the A, B, C, D, E, F and G states are applied in verification signals in program loops 1-5, 4-8, 7-11, 10-14, 13-17, 16-20 and 18-22, respectively. As mentioned, the verification signals in each program loop can encompass lower assigned data states, then midrange assigned data states and then higher assigned data states as the program operation proceeds.

FIG. 10A depicts a NAND string and corresponding channel regions in an example configuration during a pre-charge phase, where VWLss=3 V, VWLn=1 V and VWLds=1 V. The NAND string 1000 includes example memory cells 1001-1012 which are connected to word lines WL0, WLn−7 to WLn+2, . . . , WL95. The NAND string may be similar to those depicted in FIG. 7, where the memory cells are connected to word lines WL0-WL95. The NAND string has a channel 1020 with a source side channel region 1021, on a source side of WLn, and a channel region 1022 adjacent to WLn and on the drain side of WLn. The memory cells 1001-1008 are in the highest data state with Vth=5 V, for example. In practice, the data states will be randomly distributed among the memory cells but this configuration is shown as a worst case, simplified example. The WLn memory cell 1009 is in the erased state at the start of the program operation, and also throughout the program operation if that is the assigned data state of the memory cell, and the memory cells 1010-1012 are in the erased state throughout the program operation since they have not yet been selected for programming. Vth=−2 V for the erased state memory cells as an example.

The notation above each memory cell represents, from top to bottom, the word line voltage, the word line number and the Vth (in parentheses).

The memory cells are connected to a set of source side word lines 1030, WLn and a set of drain side word lines 1031. The voltage on the source side word lines is a positive voltage such as 3 V and the voltage on WLn and the drain side word lines can be a lower positive voltage such as 1 V, for instance, or 0 V. A positive bit line voltage Vbl=2 V is applied to the drain end of the NAND string at the channel region 1022. Vbl is typically set at a power supply voltage Vdd for the sense circuits and is therefore limited to this level. The memory cells 1009-1012 will be in a conductive state and allow the bit line voltage to pass since the word line voltage (VWL) minus the Vth exceeds Vbl. For example, with a word line voltage VWLds=1 V and Vth=−2 V, 1−(−2)=3 V and this exceeds Vbl=2 V.

However, the WLn−1 memory cell 1008 is cutoff or in a non-conductive state so that the pre-charge voltage from the bit line cannot pass to the source side channel region 1021. The associated channel region 1021 will therefore have a floating voltage based on VWLn-Vth. For WLn−1, the word line voltage (VWL) minus the Vth is 3−5=−2 V and this does not exceed Vbl.

VWLss denotes a word line voltage of a word line on the source side of WLn, VWLn denotes a word line voltage of WLn, and VWLds denotes a word line voltage of a word line on the drain side of WLn. The source side of WLn refers to the word lines or channel region between WLn and the source end of the NAND string. The drain side of WLn refers to the word lines or channel region between WLn and the drain end of the NAND string.

FIG. 10B depicts channel voltages (Vch) consistent with FIG. 10A. The channel region 1021 has a voltage of 3-5=−2 V (plot 1040) while the channel region 1022 has a voltage of 2 V (plot 1042). This results in a channel gradient (plot 1041) of 4 V. This is a small channel gradient which will not generate a significant amount of electron-hole pairs. The voltage at the channel region 1022 is obtained due to the bit line pre-charge.

Figure 11A:
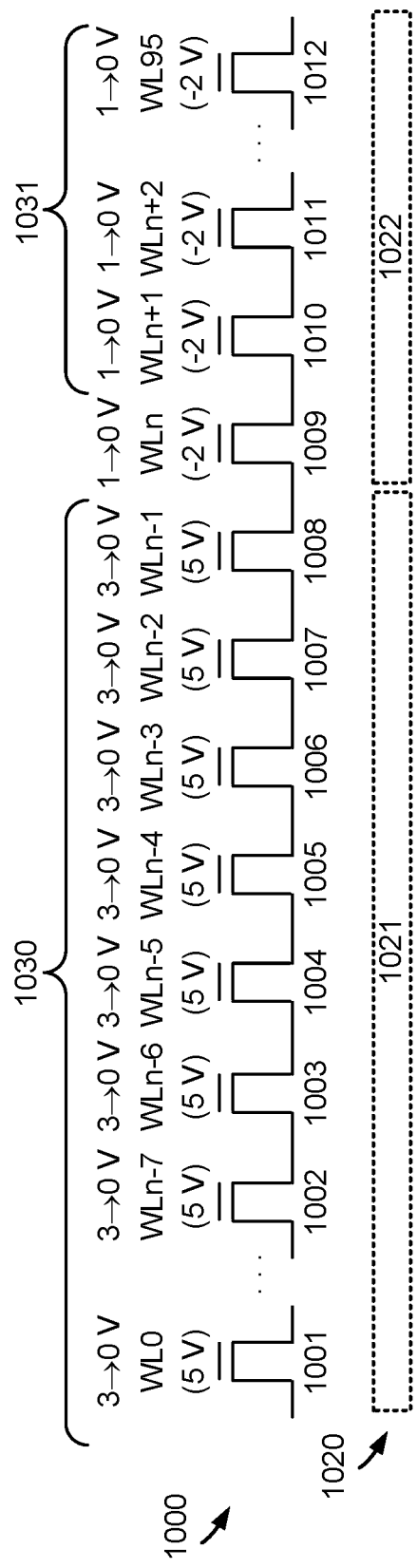
FIG. 11A depicts a NAND string and corresponding channel regions in a first example configuration during a transition period, where VWLss=3→0 V.

FIG. 11A depicts a NAND string and corresponding channel regions in a first example configuration during a transition period, where VWLss=3→0 V (the voltages decreases from 3 to 0 V). Additionally, in FIGS. 11A, 12A, 13A, 14A, 15A and 16A, VWLn=1→0 V (the voltages decreases from 1 to 0 V) and VWLds=1→0 V (the voltages decreases from 1 to 0 V). The transition period is a period between the pre-charge phase and the program phase. The transition period may be after the pre-charge phase. The word line voltages are typically decreased to 0 V and then increased from 0 V to a pass voltage such as 10 V. The decrease in the voltages occurs at t2 in FIG. 18, for example. By decreasing the word line voltages to 0 V, and then increasing the word lines voltages from 0 V to 10 V, a maximum voltage swing of 10 V can be obtained to boost the channel voltages by capacitive coupling. However, this also results in a significant channel gradient between WLn and WLn−1. Specifically, the channel region 1021 has a voltage of 0−5=−5 V (plot 1140) instead of −2 V as in FIG. 10B. The channel region 1022 has a voltage of 2 V (plot 1042) as in FIG. 10B. This results in a channel gradient (plot 1141) of 7 V and the generation of electron-hole pairs, including electrons 1145 and holes 1144. The electrons move toward the drain end of the NAND string while the holes move toward the source end of the NAND string.

Since VWLn and VWLds are at a low voltage such as 0 V, the likelihood that the electrons are drawn into the charge trapping layers of the memory cell 1009 and a few adjacent drain side memory cells is small. However, the electrons remain in the channel and pull down the pre-charge voltage from 2 V to a lower level, as denoted by the vertical downward arrow. This reduces the channel boosting level which is achieved when the word line voltages are subsequently increased to a pass voltage in preparation for the program phase. When the channel boosting level is lower in unselected NAND strings during the application of the program pulse, the gate-to-channel voltage across the memory cells connected to WLn in the unselected NAND strings is higher, so that the likelihood of program disturb is higher. As depicted in FIG. 8A and the Vth distribution 800a, for example, program disturb causes inadvertent programming (Vth upshift) of the unselected memory cells connected to WLn during the programming of the selected memory cells connected to WLn.

Vbl may decrease from 2 V to 0 V in the transition period. However, the pre-charge in the drain side of the channel will typically remain close to 2 V when the drain side memory cells are in the erased state and have a negative Vth.

Figure 11B:
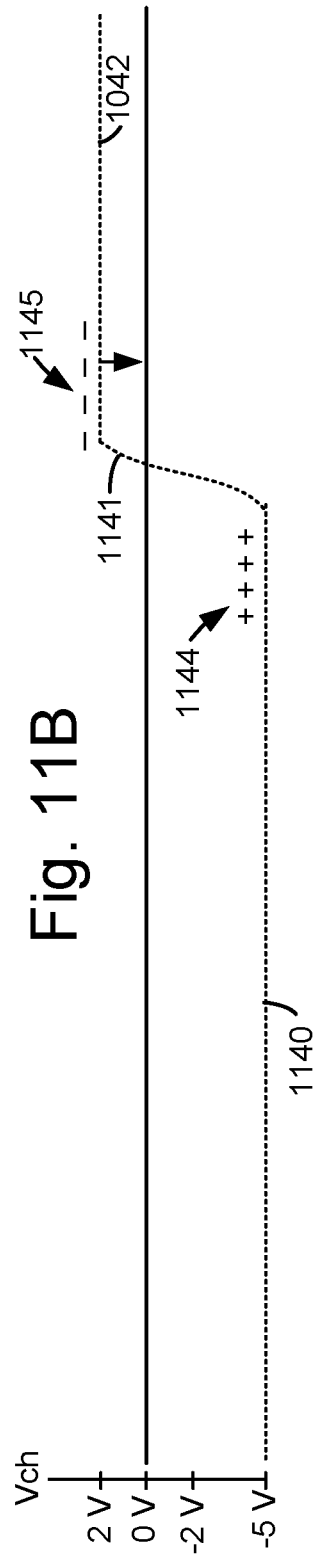
FIG. 11B depicts channel voltages consistent with FIG. 11A.

FIG. 11B depicts channel voltages consistent with FIG. 11A. The channel region 1021 associated with the subset 1030 has a voltage of −5 V (plot 1140), and the channel region 1022 associated with the set of word lines 1031 has a voltage of 2 V (plot 1042), so that a channel gradient (plot 1141) of 7 V is created.

The example of FIGS. 11A and 11B represents a case in which a program disturb countermeasure is not implemented. This case may be acceptable when there is a low risk of program disturb, such that the reduction in drain side channel boosting which is caused by the channel gradient is not a problem.

FIG. 12A depicts a NAND string and corresponding channel regions in a second example configuration during a transition period, where VWLss remains at 3 V for WLn−1 to WLn−3, and VWLss=3→0 V for remaining source side word lines. In contrast to FIG. 11A, during the transition period, VWL remains at the positive voltage used in the pre-charge phase and is not ramped down to a lower voltage, for a group of three adjacent word lines on the source side of WLn. As a result, the associated channel region is at 3−5=−2 V instead of −5 V and a reduced channel gradient of 4 V (instead of 7 V is created) at plot 1243. The amount of electron-hole pairs generated is significantly reduced so that the pull down of the channel boosting level in the drain side channel region 1022 is also reduced. In other words, the channel boosting level can be maintained in the drain side channel region.

A group 1030b of word lines is adjacent to WLn on the source side of WLn, and a group 1030a of word lines represents the remaining source side word lines. The group 1030a of word lines has a common VWL which is maintained at the positive voltage used in the pre-charge phase, e.g., 3 V, and the group 1030b of word lines has a common VWL which is reduced from the positive voltage used in the pre-charge phase, e.g., 3 V, to 0 V.

In this example, WLn−1 is an adjacent word line of WLn on the source side of WLn, having a minimum voltage VWLss_min=3 V during the transition period which is equal to the respective positive voltage during the pre-charge phase. WLn−2 and WLn−3 are non-adjacent word lines of WLn, which are on the source side of the adjacent word line, having a minimum voltage VWLss_min=3 V during the transition period which is equal to the respective positive voltage during the pre-charge phase. WL0-WLn−4 are additional non-adjacent word lines of WLn, having a minimum voltage VWLss_min=0 V during the transition period which is lower than the respective positive voltage (3 V) during the pre-charge phase, and lower than the minimum voltages on WLn−1 to WLn−3.

FIG. 12B depicts channel voltages consistent with FIG. 12A. A part of the channel region 1021 associated with the group 1030a has a voltage of −5 V (plot 1240), a part of the channel region 1021 associated with the group 1030b has a voltage of −2 V (plot 1242), and the channel region 1022 has a voltage of 2 V (plot 1042). A channel gradient (plot 1241) of 3 V is created between WLn−3 and WLn−4, and a channel gradient (plot 1243) of 4 V is created between WLn and WLn−1. These are both relatively small channel gradients which will not result in a significant pull down of the channel region 1022.

Optionally, VWL can be maintained at 3 V only for WLn−1 while VWL is decreased to 0 V for the remaining source side word lines. However, as discussed further below, e.g., in connection with FIGS. 15C and 15D, the large channel gradient of 7 V could be generated between WLn−1 and WLn2, for example, if the WLn−1 memory cell is in the erased state, so that the channel is not cutoff at WLn−1, and the WLn−2 memory cell is in the G state, so that the channel is cutoff at WLn−2. In effect, the channel gradient is shifted closer to the source end of the NAND string by one word line. By maintaining WLn at 3 V for a group of multiple adjacent word lines, the probability of this occurring is minimized.

FIG. 13A depicts a NAND string and corresponding channel regions in a third example configuration during a transition period, where VWLss remains at 3 V for WLn−1, VWLss=3→2 V for WLn−2, VWLss=3→1 V for WLn−3, and VWLss=3→0 V for remaining source side word lines. In this approach, in the transition period, a progressively larger decrease from the positive voltage of the pre-charge phase to a minimum voltage level, is used for word line which are progressively further from WLn on its source side. In the example shown, VWLn−1 is not decreased from 3 V, VWLn−2 is decreased from 3 to 2 V, VWLn−3 is decreased from 3 to 1 V, and VWLss is decreased from 3 to 0 V for the remaining source side word lines. This approach results in a more gradual decrease of the channel voltage between WLn−1 and WLn−4.

FIG. 13B depicts channel voltages consistent with FIG. 13A. A part of the channel region 1021 associated with the group 1030a has a voltage of −5 V (plot 1240), a part of the channel region 1021 associated with WLn−3 has a voltage of −4 V (plot 1341), a part of the channel region 1021 associated with WLn−2 has a voltage of −3 V (plot 1343), a part of the channel region 1021 associated with WLn−1 has a voltage of −2 V (plot 1345), and the channel region 1022 has a voltage of 2 V (plot 1042).

Channel gradients of 1 V are created between WLn−3 and WLn−4 (plot 1340), WLn−2 and WLn−3 (plot 1342), and WLn−1 and WLn−2 (plot 1344). A channel gradient (plot 1243) of 4 V is created between WLn and WLn−1, as in FIG. 12B. These are relatively small channel gradients which will not result in a significant pull down of the channel region 1022.

In this example, WLn−1 is an adjacent word line of WLn on the source side of WLn, having a minimum voltage VWLss_min=3 V during the transition period which is equal to the respective positive voltage during the pre-charge phase. WLn−2 is a non-adjacent word line of WLn, which is on the source side of the adjacent word line, having a minimum voltage VWLss_min=2 V during the transition period which is lower than the respective positive voltage (3 V) during the pre-charge phase, and lower than the minimum voltage on WLn−1. WLn−3 is a non-adjacent word line of WLn, which is on the source side of the adjacent word line, having a minimum voltage VWLss_min=1 V during the transition period which is lower than the respective positive voltage (3 V) during the pre-charge phase, and lower than the minimum voltage on WLn−1 and WLn−2. WL0-WLn−4 are additional non-adjacent word lines of WLn, having a minimum voltage VWLss_min=0 V during the transition period which is lower than the respective positive voltage (3 V) during the pre-charge phase, and lower than the minimum voltages on WLn−1 to WLn−3.

FIG. 14A depicts a NAND string and corresponding channel regions in a fourth example configuration during a transition period, where VWLss=3→2 V for WLn−1 to WLn−3, and VWLss=3→0 V for remaining source side word lines. In contrast to FIGS. 11A and 11B, where VWLss decreases from 3 V to 0 V in the transition period, and FIGS. 12A and 12B, where VWLss is maintained at 3 V in the transition period, FIGS. 13A and 13B represent an intermediate approach in which VWLss decreases slightly, from one positive voltage such as 3 V in the pre-charge phase to a lower positive voltage such as 2 V in the transition period. This results in a channel voltage of 2−5=−3 V. This approach represents a compromise between reducing the channel gradient to thereby reduce the pull down of the drain side channel region, and allowing a larger voltage swing when increasing VWLss to a pass voltage such as 10 V to thereby increase channel boosting. For example, the voltage swing for the word lines of the group 1030b may be 10−2=8 V instead of 10−3=7 V as in FIG. 12A.

In the example shown, VWLn−1 through WLn−3 are decreased from 3 to 2 V, and VWLss is decreased from 3 to 0 V for the remaining source side word lines.

FIG. 14B depicts channel voltages consistent with FIG. 14A. A part of the channel region 1021 associated with the group 1030a has a voltage of −5 V (plot 1240), a part of the channel region 1021 associated with the group 1030b has a voltage of −3 V (plot 1441), and the channel region 1022 has a voltage of 2 V (plot 1042).

A channel gradient (plot 1440) of 2 V is created between WLn−3 and WLn−4, and a channel gradient (plot 1442) of 5 V (2 V−(−3 V)) is created between WLn and WLn−1. Although the 5 V channel gradient is larger than the 4 V gradient in FIG. 12A-13B, it is still smaller than the 7 V gradient in FIGS. 11A and 11B, so that a significant pull down of the channel region 1022 is avoided. Even if some pull down occurs, this may be acceptable when a risk factor for program disturb is low.

In this example, WLn−1 is an adjacent word line of WLn on the source side of WLn, having a minimum voltage VWLss_min=2 V during the transition period which is lower than the respective positive voltage during the pre-charge phase (3 V). WLn−2 and WLn−3 are non-adjacent word lines of WLn, which are on the source side of the adjacent word line, having a minimum voltage VWLss_min=2 V during the transition period which is lower than the respective positive voltage (3 V) during the pre-charge phase. WL0-WLn−4 are additional non-adjacent word lines of WLn, having a minimum voltage VWLss_min=0 V during the transition period which is lower than the respective positive voltage (3 V) during the pre-charge phase, and lower than the minimum voltages on WLn−1 to WLn−3.

FIG. 15A depicts a NAND string and corresponding channel regions in a fifth example configuration during a transition period, where VWLss remains at 3 V for WLn−1 to WLn−3, the associated memory cells are in the erased state, and VWLss=3→0 V for remaining source side word lines. The word lines voltages are set in the same way as in FIG. 12A. However, the memory cells connected to WLn−1 to WLn−3 are in the erased state instead of the G state as in FIG. 12A. The associated channel region of the group 1030b will therefore be in a conductive state since the word line voltage (VWL) minus the Vth is 3−(−2)=5 V exceeds Vbl. The associated channel region of WLn−4 will be in a non-conductive state since the memory cell 1005 is in the G state.

As a result, a channel region 1021a with a floating voltage is created adjacent to WL0 to WL−4 and a channel region 1022a with a driven voltage is created adjacent to WLn−3 to WL95. Additionally, as shown in FIG. 15B, a large 7 V channel gradient is created between WLn−3 and WLn−4. Essentially, the channel gradient between WLn and WLn−1 in FIG. 11B is shifted three word lines over, due to the presence of the erased state memory cells 1006-1008. The electrons 1542 will cause a significant pull down of the drain side channel voltage.

However, the probability of this occurring is very small. With a random assignment of data states, and eight possible states, for example, the probability of three memory cells in a row in a NAND string being in the erased state is (⅛)^3=0.0019 or 0.19%. In another example, with sixteen possible states, the probability of two memory cells in a row being in the erased state is (1/16)^2=0.0039 or 0.39%.

Generally, the number of word lines in the group 1030*b* can be chosen so that a probability of memory cells connected to word lines in one of the NAND strings are all in the erased state is below 0.5% or other threshold. This approach reduces the likelihood of the gradient-shifting result of FIG. 15B to an acceptable level.

For example, when the memory cells are configured to store three bits per cell in eight data states, the group 1030*b* of adjacent word lines may comprise at least three word lines. And, when the memory cells are configured to store four bits per cell in sixteen data states, the group of adjacent word lines may comprise at least two word lines.

FIG. 15B depicts channel voltages consistent with FIG. 15A. The channel region 1021*a* associated with the group 1030*a* has a voltage of −5 V (plot 1240), and the channel region 1022*a* associated with the group 1030*b*, WLn and the group 1031 has a voltage of 2 V (plot 1042*a*). A channel gradient of 7 V is created between WLn−3 and WLn−4 (plot 1540), generating holes 1541 and electrons 1542.

Figure 15C:
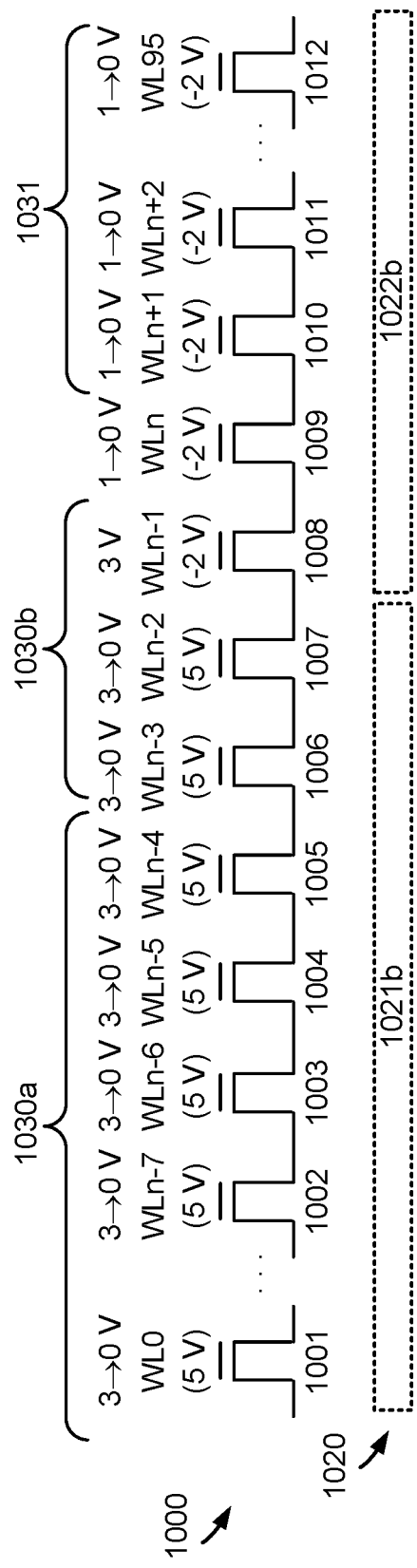
FIG. 15C depicts a NAND string and corresponding channel regions in a sixth example configuration during a transition period, where VWLss remains at 3 V for WLn−1, the associated memory cell is in the erased state, and VWLss=3→0 V for remaining source side word lines.

FIG. 15C depicts a NAND string and corresponding channel regions in a sixth example configuration during a transition period, where VWLss remains at 3 V for WLn−1, the associated memory cell is in the erased state, and VWLss=3→0 V for remaining source side word lines. The memory cell 1008 is in the erased state and the memory cells 1006 and 1007 are in the G state in contrast to FIG. 15A in which the memory cells 1006-1008 are in the erased state. This situation is more likely to occur than the situation of FIG. 15A. The word line voltages are set as in FIG. 15A. In particular, the voltages of the group 1030*a* of word lines are decreased from 3 V to 0 V while the voltages of the group 1030*b* of word lines are maintained at 3 V.

The channel region associated with WLn−1 is in the conductive state since the memory cell 1008 is in the erased state. Since the memory cell 1007 is non-conductive, a channel region 1021*b* is created adjacent to WL0 to WLn−2 and a channel region 1022*b* is created adjacent to WLn−1 to WL95.

Figure 15D:
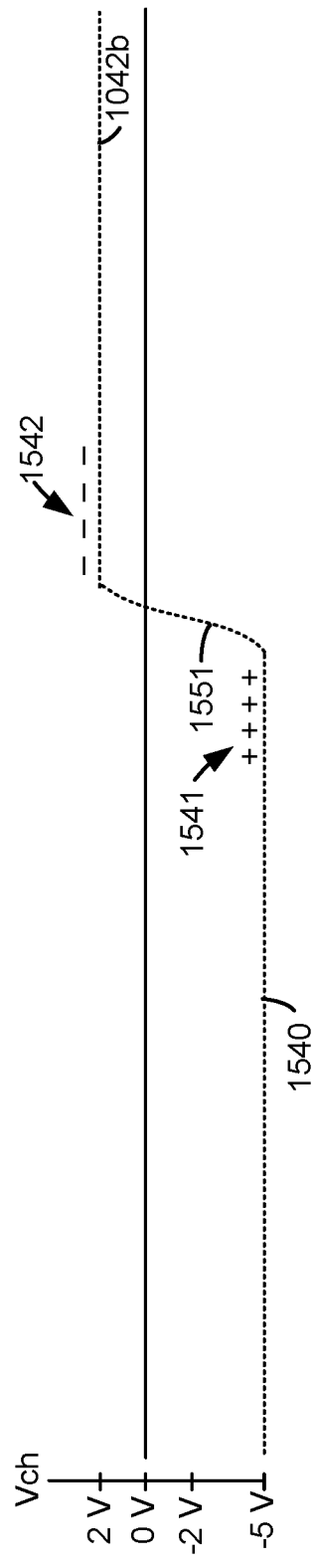
FIG. 15D depicts channel voltages consistent with FIG. 15C.

FIG. 15D depicts channel voltages consistent with FIG. 15C. The channel region 1021*b* has a voltage of −5 V (plot 1540), and the channel region 1022*b* has a voltage of 2 V (plot 1042*b*). A channel gradient of 7 V is created between WLn−3 and WLn−4 (plot 1551), generating holes 1541 and electrons 1542. This situation can be avoided by maintaining the voltage at 3 V for a group of multiple adjacent word lines rather than a single word line.

In this example, WLn−1 is an adjacent word line of WLn on the source side of WLn, having a minimum voltage VWLss_min=3 V during the transition period which is equal to the respective positive voltage during the pre-charge phase (3 V). WLn−2 and WLn−3 are non-adjacent word lines of WLn, which are on the source side of the adjacent word line, having a minimum voltage VWLss_min=0 V during the transition period which is lower than the respective positive voltage (3 V) during the pre-charge phase, and lower than the minimum voltage on WLn−1. WL0-WLn−4 are additional non-adjacent word lines of WLn, having a minimum voltage VWLss_min=0 V during the transition period which is lower than the respective positive voltage (3 V) during the pre-charge phase, and lower than the minimum voltages on WLn−1 to WLn−3.

FIG. 16A depicts a NAND string and corresponding channel regions in a seventh example configuration during a transition period, where VWLss remains at 3 V for WLn−1 to WLn−3, the associated memory cells of WLn−1 and WLn−2 are in the erased state, the associated memory cell of WLn−3 is in the G state, and VWLss=3→0 V for remaining source side word lines.

The memory cells 1007 and 1008 are in the erased state and the memory cell 1006 is in the G state. This situation is more likely to occur than the situation of FIG. 15A and less likely to occur than the situation in FIG. 15C. The word line voltages are set as in FIG. 15A. In particular, the voltages of the group 1030*a* of word lines are decreased from 3 V to 0 V while the voltages of the group 1030*b* of word lines are maintained at 3 V.

The channel region associated with WLn−1 and WLn−2 is in the conductive state since the memory cells 1008 and 1007 are in the erased state. Since the memory cell 1006 is non-conductive, a channel region 1021*c* is created adjacent to WL0 to WLn−3 and a channel region 1022*c* is created adjacent to WLn−2 to WL95.

FIG. 16B depicts channel voltages consistent with FIG. 16A. A portion of the channel region 1021*c* adjacent to WL0 to WLn−4 has a voltage of −5 V (plot 1640), a portion of the channel region 1021*c* adjacent to WLn−3 has a voltage of −2 V (3 V−5 V) (plot 1642), and the channel region 1022*c* has a voltage of 2 V (plot 1042*c*). A channel gradient of 3 V is created between WLn−3 and WLn−4 (plot 1641), and a channel gradient of 4 V is created between WLn−2 and WLn−3 (plot 1643). These are relatively small channel gradients which will not significantly pull down the drain side channel voltage. This example shows that by maintaining 3 V on a group of multiple, e.g., three, word lines adjacent to WLn during the transition period, the presence of one memory cell in the G state helps reduce the peak channel voltage. The cutoff in the channel region of the G state memory cell allows for a gradual step down in the channel voltage.

The memory cell 1006 will be in a non-conductive state and the associated channel region will be cutoff when the word line voltage (VWL) minus the Vth of the memory cell does not exceed the drain side channel voltage, Vd. If we assume Vth=5 V and Vd=2 V, the memory cell 1006 will be in a non-conductive state when VWL−5 V<=2 V, or VWL<=7 V.

In this example, WLn−1 is an adjacent word line of WLn on the source side of WLn, having a minimum voltage VWLss_min=3 V during the transition period which is equal to the respective positive voltage during the pre-charge phase (3 V). WLn−2 and WLn−3 are non-adjacent word lines of WLn, which are on the source side of the adjacent word line, having a minimum voltage VWLss_min=3 V during the transition period which is equal to the respective positive voltage (3 V) during the pre-charge phase. WL0-WLn−4 are additional non-adjacent word lines of WLn, having a minimum voltage VWLss_min=0 V during the transition period which is lower than the respective positive voltage (3 V) during the pre-charge phase, and lower than the minimum voltages on WLn−1 to WLn−3.

FIG. 17A depicts a flowchart of an example process for performing a program operation. A program operation can include a series of program loops such as discussed in connection with FIG. 9A. Step 1700 begins a program loop for a selected word line, WLn. Step 1701 performs a pre-charge phase of the program loop. Step 1702 performs a transition between the pre-charge phase and a program phase which optimizes a channel pre-charge, e.g., to reduce program disturb. That is, the channel pre-charge is maintained in a transition period. Step 1703 performs a program phase of the program loop. Step 1704 performs a verify phase of the program loop. See also FIG. 18, which depicts the pre-charge phase 1806, a transition period 1807, the program phase 1808 and a verify phase 1809.

A decision step 1705 determines if there is a next program loop. A next program loop is performed is the program operation is not yet completed. If the decision step 1705 is true, step 1700 is repeated by starting the next program loop. If the decision step 1705 is false, step 1706 indicates the program operation is done.

The steps may be performed sequentially. The process can be repeated for each sub-block of a block.

FIG. 17B depicts a flowchart of an example process for performing the pre-charge phase of step 1701 of FIG. 17A. See t0-t1 in FIG. 18. Step 1710 includes applying a turn-on voltage of Vsgd=Vsgs=6 V to the SGD and SGS transistors, to provide them in a strongly conductive state. Step 1711 includes applying a bit line pre-charge of Vbl_unsel=2 V. Step 1712 includes applying Vbl_sel=0 V to the bit lines of the selected NAND strings. Step 1713 includes applying a pre-charge voltage of VWLds=1 V (a positive voltage) to the drain-side word lines of WLn. This provides the associated channel regions in a conductive state to pass the bit line voltage into the channel. Step 1714 includes applying a pre-charge voltage of VWLn=1 V (a positive voltage) to the selected word line. This also provides the associated channel region in a conductive state to pass the bit line voltage into the channel, when a WLn memory cell is in the erased state or a low state, at the beginning of a program operation, or throughout the program operation.

Step 1715 includes applying a pre-charge voltage VWLss=3 V (a positive voltage) to the source-side word lines of WLn. The associated channel regions are in a non-conductive state since the memory cells have been programmed to higher Vth levels in previous program operations according to the word line programming order of a block. The bit line pre-charge therefore mainly pre-charges the portion of the channel on the drain side of WLn. Step 1716 includes applying Vsl=1 V to the source line. Vsl could provide a pre-charge to the source side of the NAND string, although typically the presence of high state memory cells will cutoff the channel.

The steps may be performed concurrently. The voltages depicted in the various figures are examples.

Figure 17C:
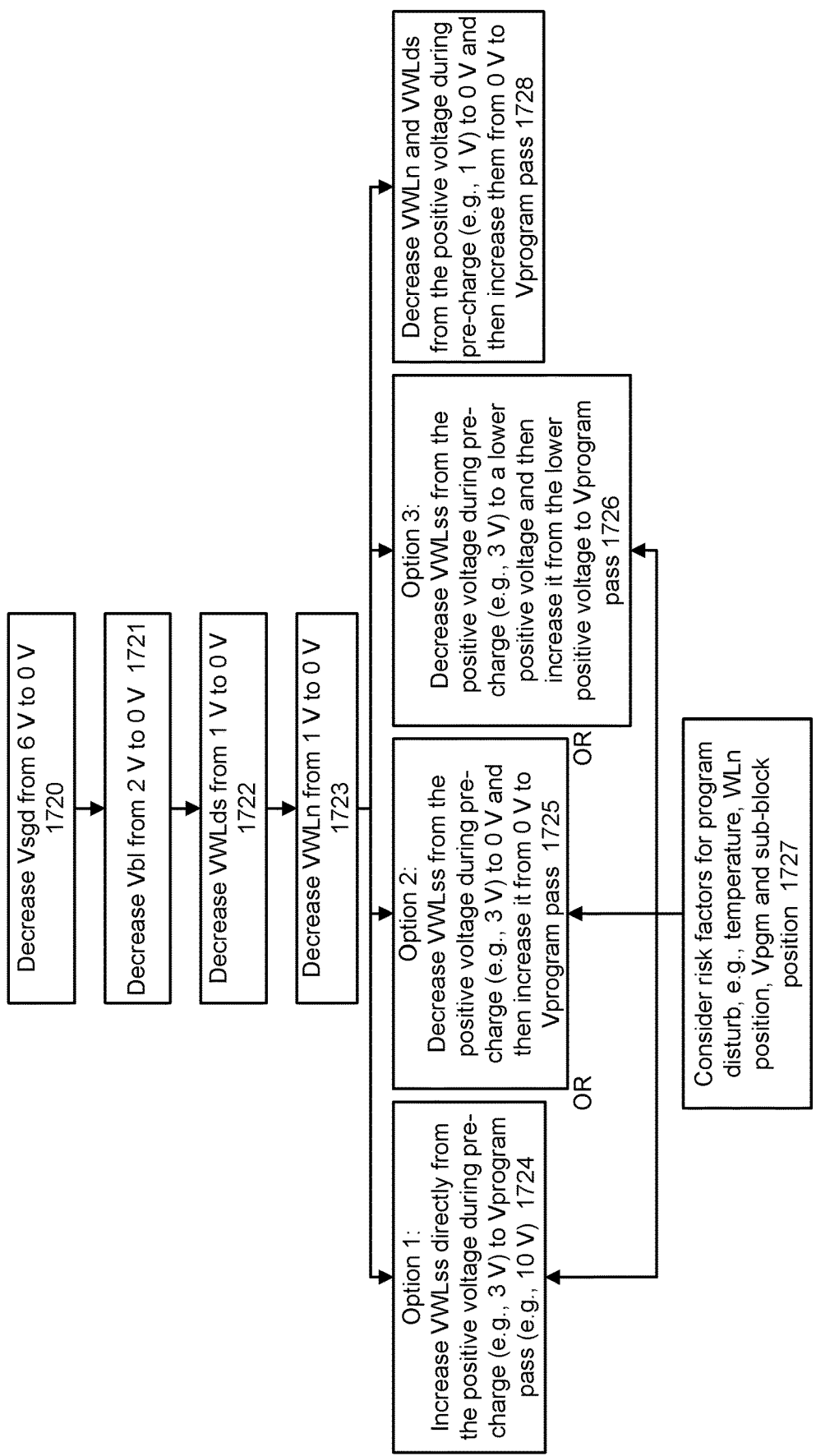
FIG. 17C depicts a flowchart of an example process for performing the transition of step 1702 of FIG. 17A.

FIG. 17C depicts a flowchart of an example process for performing the transition of step 1702 of FIG. 17A. See t1-t4 in FIG. 18. Step 1720 includes decreasing the select gate voltage Vsg from 6 V to 0 V. This can occur at t1, for example. Step 1721 includes decreasing Vbl from 1 V to 0 V. This can also occur at t1, for example. Step 1722 includes decreasing VWLds from 1 V to 0 V. This can occur at t2, for example. Step 1723 includes decreasing VWLn from 1 V to 0 V. This can also occur at t2, for example. Subsequently, step 1724, 1725 or 1726 is performed, along with step 1728. Step 1724 (Option 1) involves increasing VWLss directly from the positive voltage during pre-charge (e.g., 3 V) to Vprogram pass (e.g., 10 V). See plots 1821 and 1824. In this case, VWLss does not decrease in the transition period. Step 1725 (Option 2) involves decreasing VWLss from the positive voltage during pre-charge (e.g., 3 V) to 0 V and then increasing it from 0 V to Vprogram pass. See plots 1821, 1822 and 1826.

Step (Option 3) 1726 involves decreasing VWLss from the positive voltage during pre-charge (e.g., 3 V) to a lower positive voltage (e.g., between 0 and 3 V such as 1 or 2 V) and then increasing it from the lower positive voltage to Vprogram pass. See the decrease from plot 1821 to plot 1823 at t2 and the increase of plot 1825 from t3-t4.

The selection of one of steps 1724-1726 can be responsive to step 1727, which involves considering risk factors for program disturb such as temperature, WLn position, Vpgm magnitude and sub-block position. See also FIG. 19A-19D. This can be done by the control circuitry 110 or the controller 122 of FIG. 1, for example. Step 1724, 1725 or 1726 can be selected if the risk of program disturb is high, low or medium, respectively. The selection of one of steps 1724-1726 can be made for one or more source side word lines of WLn.

Step 1728 involves decreasing VWLn and VWLds from the positive voltage during pre-charge (e.g., 1 V) to 0 V and then increasing them from 0 V to Vprogram pass. See the decrease of voltage signals 1800 and 1810 at t2 and the increase from t3-t4.

FIG. 17D depicts a flowchart of an example process for performing the program phase of step 1703 of FIG. 17A. Step 1730 includes applying Vsgd_sel=2.5 V to the selected SGD transistors, e.g., the SGD transistors in a selected sub-block. Step 1731 includes applying Vsgd_unsel=Vsgs=0 V. Vsgd_unsel is for the SGD transistors in the unselected sub-blocks. This provides the unselected SGD transistors in a non-conductive state. Step 1732 includes applying Vbl_unsel=2 V to the inhibited bit lines. This provides the associated SGD transistors in a non-conductive state to allow channel boosting to occur. Step 1733 include applying Vbl_sel=0 V to the programmed bit lines. This provides the associated SGD transistors in a conductive state to allow programming to occur. Step 1734 includes applying a program pass voltage of Vprogram pass=8-10 V to the unselected word lines. This boosts the associated channel regions in the inhibited or unselected NAND strings. Step 1735 includes applying a program voltage of Vpgm (e.g., 20-30 V) to the selected word line. This provides a high gate-to-channel voltage which programs the WLn memory cells in the selected NAND strings. Step 1736 includes applying Vsl to the source line. This provides a back bias for the SGS transistors to reduce leakage.

The steps may be performed concurrently.

FIG. 17E depicts a flowchart of an example process for performing the verify phase of step 1704 of FIG. 17A. Step 1740 sets Vsgd_unsel=0 V. Step 1741 includes applying a turn-on voltage of Vsgs=6 V to the SGS transistors. Step 1742 includes setting Vbl_sel=0.5 V. Step 1743 includes setting Vbl_unsel=2 V. Step 1744 includes setting VWL=Vverify, a verify voltage. Step 1745 includes setting VWLunsel=Vverify pass, a verify pass voltage, such as 8-10 V. Step 1746 includes setting Vsl=1 V. Step 1747 includes sensing the memory cells.

A decision step 1748 determines if there is a next Vverify to apply to WLn. If the decision step 1748 is true, step 1744 is repeated by applying the next Vverify to WLn. If the decision step 1748 is false, step 1749 indicates the process is done.

The steps may be performed concurrently.

FIG. 18 depicts example voltage signals for performing the process of FIG. 17A. The vertical dimension denotes voltage and the horizontal dimension denotes time, with time points t0-t11. The period of time depicted corresponds to one program loop and includes a pre-charge phase 1806 (t0-t1), a transition period 1807 (t1-t3), a program phase 1808 (t3-t8) and a verify phase 1809 (t9-t11). Voltage signals 1800, 1810, 1820, 1830, 1840 and 1850 depict VWLn, VWLds, VWLss, Vsgd, Vbl and Vsl, respectively. VWLds is the voltage applied to the drain side word lines of WLn. Typically, one common voltage is applied to these word lines. VWLss is the voltage applied to the source side word lines of WLn, and can include different values for different source side word lines, as discussed in previous examples.

In the pre-charge phase, VWLn and VWLds can be set to a pre-charge voltage such as 1 V. In some cases, VWLn can differ from VWLds in the pre-charge phase. VWLss can be set to a pre-charge voltage such as 3 V. In one approach, one common voltage is applied to the source side word lines in the pre-charge phase.

A positive Vbl (e.g., 2 V) is provided to the drain-side channels of the inhibited NAND strings via the respective bit lines to remove residue electrons and to provide a small amount of boosting such as 2 V. The SGD transistors of the selected and unselected sub-blocks are in a conductive state at this time, with a voltage of Vsgd=6 V, for example. This allows the bit line voltage to be passed to the drain end channel. It is also possible for the SGS transistors of the selected and unselected sub-blocks to be in a conductive state at this time, with a voltage of 6 V, for example to allow Vsl to be passed to the source end of the channel.

In the transition period, plot 1824 shows the option of step 1724 of FIG. 17C, where VWLss increases directly from the respective positive voltage of the pre-charge phase to Vprogram pass. Plots 1821, 1822 and 1826 show the option of step 1725 of FIG. 17C, where VWLss decreases from the respective positive voltage of the pre-charge phase to 0 V and then increases from 0 V to Vprogram pass. Plots 1821, 1823 and 1825 show the option of step 1726 of FIG. 17C, where VWLss decreases from the respective positive voltage of the pre-charge phase to a lower positive voltage and then increases from the lower positive voltage to Vprogram pass. As discussed, the decrease or ramp down of VWLss at t2 can result in a channel gradient which pulls down the voltage of the drain side channel region of a NAND string.

The increase of VWLn, VWLds and VWLss in the transition period to Vprogram pass provides a capacitive coupling up of the channels of the inhibited NAND strings. The amount of the increase is a voltage swing. As mentioned, the coupling up is greater when the voltage swing is greater. However, as a tradeoff, the voltage swing and the coupling up may be reduced to prevent a channel gradient which pulls down the drain side channel voltage. The voltage swing is reduce by starting the increase at a positive voltage such as 3 V rather than at 0 V.

VWLss_min is the minimum value of VWLss during the transition period. VWLss_min can be different for different word lines on the source side of WLn. For example, plots 1821, 1822 and 1823 denote a VWLss_min of 3 V, 0 V and 2 V, respectively. VWLss_min denotes respective minimum voltages of word lines during the transition period.

In the program phase, VWLds and VWLss are maintained at Vprogram pass. VWLn is ramped up further at t5 to the peak program pulse level of Vpgm and held at Vpgm until t6. After the application of the program pulse, the word line voltages are ramped down in a recovery process. During the program pulse, Vsgd_sel (plot 1831) is high enough to provide the selected SGD transistors in a conductive state for the selected NAND strings, which receive Vbl_sel=0 V (plot 1842), but low enough to provide the selected SGD transistors in a non-conductive state for the inhibited NAND strings, which receive Vbl_unsel=2 V (plot 1841). Vsgd_unsel (plot 1832) is 0 V to provide the unselected SGD transistors in a non-conductive state for the unselected NAND strings, which receive Vbl_unsel=0 V.

Subsequently, in the verify phase, one or more verify tests are performed by applying one or more verify voltages on WLn and, for each verify voltage, sensing the conductive state of the memory cells in the selected NAND strings of the selected sub-block. The SGD and SGS transistors are in a strongly conductive state to allow sensing to occur for the selected memory cells. In this example, the verify test is performed by applying VvE and VvF to WLn at t9-t10 and t10-t11, respectively, consistent with program loops 16 and 17 in FIG. 9B.

FIG. 19A depicts an example plot of VWLss_min versus temperature (Temp.). A lower temperature is associated with a higher risk of program disturb. Accordingly, one possible program disturb countermeasure is to set a relatively high VWLss_min when the temperature is relatively low, e.g., below a threshold of Temp_th such as 25 C. At low temperatures, electrons encounter fewer scattering events when flowing in the channel. The electrons may therefore keep a higher velocity and have a higher probability of moving in the drain side channel region and pulling down the voltage.

In one approach, VWLss_min is set to the positive voltage used in the pre-charge phase, e.g., 3 V, when the temperature is below Temp_th, and to a lower voltage such as 0 V when the temperature is at or above Temp_th, for one or more source side word lines of WLn. See the dashed line plot. Or, VWLss_min can decrease progressively as the temperature increases, for one or more source side word lines of WLn. See the solid line plot. VWLss_min can be a decreasing function of the temperature. That is, VWLss_min can decrease as the temperature increases. In one approach, VWLss_min in the figure refers to a group of word lines adjacent to WLn, and the remaining source side word lines may have a VWLss_min=0 V, for example, regardless of temperature.

FIG. 19B depicts an example plot of VWLss_min versus the position of WLn. When WLn is further from the source ends of the NAND strings in a block, the drain side region of the channel is relatively small and has a relatively small capacitance. As a result, it is more difficult to boost the channel region when increasing the word line voltages to Vpass in the transition period, resulting in a higher risk of program disturb. Also, it is easier for the electrons generated by a channel gradient to pull down the voltage of the drain side channel region. The distance of WLn from the source side of the NAND strings is therefore a risk factor for program disturb.

As a result, a countermeasure for preventing program disturb can be adjusted based on the position of WLn in a block or stack, where the technique provides a stronger countermeasure when the distance of WLn from the source side of the NAND strings, or from a first-programmed word line of the block, is greater.

One approach is to set VWLss_min=0 V when the WLn position is relatively close to the source side of the NAND strings, and to set VWLss_min to the positive voltage used in the pre-charge phase, e.g., 3 V, when the WLn position is relatively far from the source side of the NAND strings. See the dashed line plot. In this case, VWLss_min is an increasing function of the distance of WLn from the source side of the NAND strings. That is, VWLss_min is relatively higher when the distance is relatively great. In one approach, with 96 word lines, VWLss_min=0 V when WLn is in the bottom two thirds of word lines, e.g., WL0-WL64, and VWLss_min=3 V when WLn is in the top one third of word lines, e.g., WL65-WL95. In another option, VWLss_min increases progressively as the distance of WLn from the source side increases. See the solid line plot. For example, VWLss_min=0 V when WLn is WL0-WL64, VWLss_min=1 V when WLn is WL65-WL74, VWLss_min=2 V when WLn is WL75-WL84, and VWLss_min=3 V when WLn is WL85-WL95.

FIG. 19C depicts an example plot of VWLss_min versus Vpgm. As mentioned, the magnitude of Vpgm is a risk factor for program disturb which occurs during the program phase of a program loop. When Vpgm is greater, there is a greater gate-to-channel voltage which can cause a gate-to-channel type of program disturb in the program phase. A countermeasure is to transition VWLss_min directly from the positive voltage of the pre-charge phase to Vprogram pass in the transition period.

In this example, Vpgm ranges from a minimum of Vpgm_init to a maximum of Vpgm_max, and Vpgm_th is a threshold Vpgm for changing from a mode in which VWLss_min=0 V to a mode in which VWLss_min=3 V. See the dashed line plot. In another option, VWLss_min increases progressively as the magnitude of Vpgm increases. See the solid line plot.

FIG. 19D depicts an example plot of VWLss_min versus a selected sub-block, SBsel. As mentioned, the memory cells of a word line WLn can be programmed one sub-block at a time. In this programming technique, the memory cells in the first-programmed sub-block (SB0) are subject to the highest risk of program disturb because, while in a programmed state, they are inhibited from programming during the programming of three other sub-blocks, e.g., SB1-SB3. Similarly, the memory cells in the second and third programmed sub-blocks (SB1 and SB2, respectively) are subject to the second and third highest risk, respectively, of program disturb. The last programmed sub-block, SB3, is subject to the lowest risk of program disturb because it is not inhibited after being programmed. As a result, a countermeasure for preventing program disturb can be adjusted on a per sub-block basis, where the technique provides a stronger countermeasure (e.g., higher VWLss_min) during programming of a later-programmed sub-block in a sub-block programming order. A risk factor for program disturb comprises a number of sub-blocks in a plurality of sub-blocks of a block which were programmed before a selected sub-block. The risk is greater when this number is greater.

One approach is to increase VWLss_min when a later-programmed sub-block is the selected sub-block. For example, when programming SB3, the number of earlier-programmed sub-blocks is a maximum at three blocks, so that VWLss_min can be set to a maximum value, indicating that VWLss_min remains at the positive voltage of the pre-charge phase, e.g., 3 V, and is not decreased in the transition period.

When programming SB2, the number of earlier-programmed sub-blocks is lower at two, and VWLss_min can be set to a next lower voltage of, e.g., 2 V. When programming SB1, the number of earlier-programmed sub-blocks is lower still at one, and VWLss_min can be set to a next lower voltage of, e.g., 1 V. When programming SB0, the number of earlier-programmed sub-blocks is lowest at zero, and VWLss_min can be set to the lowest voltage of 0 V.

For example, assume that a program operation uses 20 program loops. When the WLn memory cells in SB0 are programmed, the WLn memory cells in SB1-SB3 are subject to the pre-charge conditions 20 times. However, since they are in the erased state, the conditions for generating a channel gradient such as in FIGS. 11A and 11B are not present. When the WLn memory cells in SB1 are programmed, the WLn memory cells in SB0 are programmed so that the conditions for generating a channel gradient are present in SB0. The WLn memory cells in SB0 are subject to the pre-charge conditions 20 times. When the WLn memory cells in SB2 are programmed, the WLn memory cells in SB0 are subject to the pre-charge conditions a total of 40 times and the WLn memory cells in SB1 are subject to the pre-charge conditions 20 times. When the WLn memory cells in SB3 are programmed, the WLn memory cells in SB0, SB1 and SB2 are subject to the pre-charge conditions a total of 60, 40 and 20 times, respectively. By increasing VWLss_min as the later sub-blocks are programmed, the effects of the additional exposure to the pre-charge conditions in the earlier programmed sub-blocks can be reduced.

For example, the WLn memory cells of SB0 may be subject to the pre-charge 20 times with VWLss_min=0 V, 20 times with VWLss_min=2 V and 20 times with VWLss_min=3 V. The disturb is less than if the WLn memory cells of SB0 were subject to the pre-charge 60 times with VWLss_min=0 V.

In one approach, VWLss_min is greater when the number of sub-blocks in the plurality of sub-blocks which are programmed before the selected sub-block is greater. In other words, VWLss_min is greater when the currently programmed sub-block is programmed later in a sub-block programming order.

Accordingly, it can be see that in one implementation, an apparatus comprises: a set of memory cells arranged in NAND strings, each NAND string comprising a channel; a plurality of word lines connected to the set of memory cells, the plurality of word lines comprise a selected word line in a program operation, an adjacent of the selected word line on a source side of the selected word line, and a non-adjacent word line on the source side of the adjacent word line; and a control circuit connected to the plurality of word lines and the respective channels. The control circuit is configured to: apply a pre-charge voltage to the channels; during the applying of the pre-charge voltage to the channel, apply a first voltage signal to the adjacent word line comprising a respective positive voltage and apply a second voltage signal to the non-adjacent word line comprising a respective positive voltage; and subsequently, in a transition period: transition a voltage of the first voltage signal from the respective positive voltage to a pass voltage, the first voltage signal comprising a respective minimum voltage during the transition, and transition a voltage of the second voltage signal from the respective positive voltage to the pass voltage, the voltage of the second voltage signal comprising a respective minimum voltage during the transition which is below the respective minimum voltage of the first voltage signal.

In another implementation, a method comprises: performing a program operation for a set of memory cells, wherein the set of memory cells are arranged in NAND strings, each NAND string comprising a channel connected to a bit line, and a plurality of word lines are connected to the set of memory cells and comprise a selected word line in the program operation, and an adjacent word line adjacent to the selected word line on a source side of the selected word line, the performing the program operation comprises: applying a pre-charge voltage to the bit lines; during the applying of the pre-charge voltage to the bit lines, applying a first voltage signal to the adjacent word line comprising a respective positive voltage; increasing the first voltage signal from the respective positive voltage directly to a pass voltage when a distance of the selected word line from a first-programmed word line of the plurality of word lines is greater than a threshold; and decreasing the first voltage signal from the respective positive voltage to a respective minimum voltage and subsequently increasing the voltage of the first voltage signal from the respective minimum voltage to the pass voltage when the distance of the selected word line from a first-programmed word line of the plurality of word lines is not greater than the threshold.

In another implementation, an apparatus comprises: a set of memory cells arranged in NAND strings in a block, each NAND string comprising a channel connected to a bit line; a plurality of word lines connected to the set of memory cells and comprising a selected word line, an adjacent word line adjacent to the selected word line on a source side of the selected word line, and a non-adjacent word line on the source side of the adjacent word line; and a control circuit connected to the plurality of word lines and the bit lines. The control circuit is configured to, in a program loop of a program operation: apply a pre-charge voltage to the bit lines; during the applying of the pre-charge voltage to the bit lines, apply a first voltage signal to the adjacent word line comprising a respective positive voltage and apply a second voltage signal to the non-adjacent word line comprising a respective positive voltage; increase the first voltage signal from the respective positive voltage directly to a pass voltage; and decrease the second voltage signal from the respective positive voltage to a respective minimum voltage and subsequently increase the voltage of the second voltage signal from the respective minimum voltage to the pass voltage.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a set of memory cells arranged in NAND strings, each NAND string comprising a channel;
a plurality of word lines connected to the set of memory cells, the plurality of word lines comprise a selected word line in a program operation, an adjacent word line of the selected word line on a source side of the selected word line, and a non-adjacent word line on the source side of the adjacent word line; and
a control circuit connected to the plurality of word lines and the channels, the control circuit is configured to:
apply a pre-charge voltage to the channels;
during the applying of the pre-charge voltage to the channel, apply a first voltage signal to the adjacent word line comprising a respective positive voltage and apply a second voltage signal to the non-adjacent word line comprising a respective positive voltage; and
subsequently, in a transition period:
transition a voltage of the first voltage signal from the respective positive voltage to a pass voltage, the first voltage signal comprising a respective minimum voltage during the transition, and
transition a voltage of the second voltage signal from the respective positive voltage to the pass voltage, the voltage of the second voltage signal comprising a respective minimum voltage during the transition which is below the respective minimum voltage of the first voltage signal, wherein the control circuit is configured to program the plurality of word lines in a word line programming order, and the respective minimum voltage of the first voltage signal in the transition period is an increasing function of a distance of the selected word line from a first-programmed word line of the plurality of word lines.

2. The apparatus of claim 1, wherein:
in the transition period, the transitioning of the voltage of the first voltage signal from the respective positive voltage to the pass voltage comprises increasing the voltage of the first voltage signal directly from the respective positive voltage to the pass voltage so that the respective minimum voltage is equal to the respective positive voltage.

3. The apparatus of claim 1, wherein:
the respective minimum voltage of the second voltage signal is a positive voltage.

4. The apparatus of claim 1, wherein:
the plurality of word lines comprise an additional non-adjacent word line on a source side of the selected word line; and
the control circuit is configured to:
during the applying of the pre-charge voltage to the channel, apply a third voltage signal to the additional non-adjacent word line comprising a respective positive voltage; and
subsequently, in the transition period, transition a voltage of the third voltage signal from the respective positive voltage to the pass voltage, the voltage of the third voltage signal comprising a respective minimum voltage during the transition which is below the respective minimum voltage of the second voltage signal.

5. The apparatus of claim 1, further comprising:
a temperature-sensing circuit configured to provide a temperature, wherein the respective minimum voltage of the first voltage signal is a decreasing function of the temperature.

6. The apparatus of claim 1, wherein:
the control circuit is configured to apply a program voltage to the selected word line while the voltage of the first voltage signal is at the pass voltage and the voltage of the second voltage signal is at the pass voltage; and
the respective minimum voltage of the first voltage signal in the transition period is an increasing function of the program voltage.

7. The apparatus of claim 1, wherein:
the control circuit is configured to apply the first voltage signal to a group of adjacent word lines;
the group of adjacent word lines comprises the adjacent word line and is adjacent to the selected word line; and
the non-adjacent word line is adjacent to the group of adjacent word lines.

8. The apparatus of claim 7, wherein:
the memory cells are configured to store three bits per cell in eight data states; and
the group of adjacent word lines comprises at least three word lines.

9. The apparatus of claim 7, wherein:
the memory cells are configured to store four bits per cell in sixteen data states; and
the group of adjacent word lines comprises at least two word lines.

10. The apparatus of claim 1, wherein:
the NAND strings are arranged in a plurality of sub-blocks in a block;

the program operation is for a selected sub-block of the plurality of sub-blocks; and the respective minimum voltage of the first voltage signal in the transition period is greater when a number of sub-blocks in the plurality of sub-blocks which are programmed before the selected sub-block is greater.

11. A method, comprising:
performing a program operation for a set of memory cells, wherein the set of memory cells are arranged in NAND strings, each NAND string comprising a channel connected to a bit line, and a plurality of word lines are connected to the set of memory cells and comprise a selected word line in the program operation, and an adjacent word line adjacent to the selected word line on a source side of the selected word line, the performing the program operation comprises:
   applying a pre-charge voltage to the bit lines;
   during the applying of the pre-charge voltage to the bit lines, applying a first voltage signal to the adjacent word line comprising a respective positive voltage;
   increasing the first voltage signal from the respective positive voltage directly to a pass voltage when a distance of the selected word line from a first-programmed word line of the plurality of word lines is greater than a threshold; and
   decreasing the first voltage signal from the respective positive voltage to a respective minimum voltage and subsequently increasing the first voltage signal from the respective minimum voltage to the pass voltage when the distance of the selected word line from a first-programmed word line of the plurality of word lines is not greater than the threshold; and
   applying a program voltage to the selected word line while the voltage of the first voltage signal is at the pass voltage, wherein the respective minimum voltage of the first voltage signal is an increasing function of the program voltage.

12. The method of claim 11, wherein:
during the decreasing the first voltage signal, the respective minimum voltage of the first voltage signal is an increasing function of the distance of the selected word line from the first-programmed word line of the plurality of word lines.

13. The method of claim 11, wherein:
during the decreasing the first voltage signal, the respective minimum voltage of the first voltage signal is a decreasing function of a temperature.

14. The method of claim 11, wherein the plurality of word lines comprise a non-adjacent word line on a source side of the adjacent word line, the method further comprising:
   during the applying of the pre-charge voltage to the bit lines, applying a second voltage signal to the non-adjacent word line comprising a respective positive voltage; and
   decreasing the second voltage signal from the respective positive voltage to a respective minimum voltage and subsequently increasing a voltage of the second voltage signal from the respective minimum voltage to the pass voltage, wherein the respective minimum voltage of the second voltage signal is less than the respective minimum voltage of the first voltage signal.

15. An apparatus, comprising:
a set of memory cells arranged in NAND strings in a block, each NAND string comprising a channel connected to a bit line;
a plurality of word lines connected to the set of memory cells and comprising a selected word line, an adjacent word line adjacent to the selected word line on a source side of the selected word line, and a non-adjacent word line on the source side of the adjacent word line; and
a control circuit connected to the plurality of word lines and the bit lines, the control circuit is configured to, in a program loop of a program operation:
   apply a pre-charge voltage to the bit lines;
   during the applying of the pre-charge voltage to the bit lines, apply a first voltage signal to the adjacent word line comprising a respective positive voltage and apply a second voltage signal to the non-adjacent word line comprising a respective positive voltage;
   increase the first voltage signal from the respective positive voltage directly to a pass voltage; and
   decrease the second voltage signal from the respective positive voltage to a respective minimum voltage which is a positive voltage and subsequently increase the second voltage signal from the respective minimum voltage to the pass voltage.

16. The apparatus of claim 15, wherein:
the respective positive voltage of the first voltage signal is equal to the respective positive voltage of the second voltage signal.

17. The apparatus of claim 15, wherein the plurality of word lines comprise an additional non-adjacent word line on a source side of the non-adjacent word line, and the control circuit is configured to:
   during the applying of the pre-charge voltage to the bit lines, apply a third voltage signal to the additional non-adjacent word line comprising a respective positive voltage; and
   decrease the third voltage signal from the respective positive voltage to a respective minimum voltage which is a positive voltage and subsequently increase the third voltage signal from the respective minimum voltage to the pass voltage, wherein the respective minimum voltage of the third voltage signal is less than the respective minimum voltage of the second voltage signal.

18. The apparatus of claim 15, wherein the control circuit is configured to:
   during the applying of the pre-charge voltage to the bit lines, apply the first voltage signal to a group of adjacent word lines;
   the group of adjacent word lines comprises the adjacent word line and is adjacent to the selected word line; and
   the non-adjacent word line is adjacent to the group of adjacent word lines.

19. The apparatus of claim 1, wherein:
in the transition period, the transitioning of the voltage of the first voltage signal from the respective positive voltage to the pass voltage comprises decreasing the voltage of the first voltage signal from the respective positive voltage to the respective minimum voltage followed by increasing the voltage of the first voltage signal from the respective minimum voltage to the pass voltage.

20. An apparatus, comprising:
a control circuit configured to connect to a plurality of word lines and to channels of NAND strings, wherein a set of memory cells is arranged in the NAND strings, the plurality of word lines are connected to the set of memory cells, the plurality of word lines comprise a selected word line in a program operation, an adjacent word line of the selected word line on a source side of the selected word line, and a non-adjacent word line on the source side of the adjacent word line, and the control circuit is configured to:

apply a pre-charge voltage to the channels;

during the applying of the pre-charge voltage to the channel, apply a first voltage signal to the adjacent word line comprising a respective positive voltage and apply a second voltage signal to the non-adjacent word line comprising a respective positive voltage; and subsequently, in a transition period:

transition a voltage of the first voltage signal from the respective positive voltage to a pass voltage, the first voltage signal comprising a respective minimum voltage during the transition, and transition a voltage of the second voltage signal from the respective positive voltage to the pass voltage, the voltage of the second voltage signal comprising a respective minimum voltage during the transition which is below the respective minimum voltage of the first voltage signal, wherein the control circuit is configured to program the plurality of word lines in a word line programming order, and the respective minimum voltage of the first voltage signal in the transition period is an increasing function of a distance of the selected word line from a first-programmed word line of the plurality of word lines.

* * * * *